United States Patent
Miller et al.

(10) Patent No.: US 8,069,429 B2
(45) Date of Patent: *Nov. 29, 2011

(54) DETAILED PLACER FOR OPTIMIZING HIGH DENSITY CELL PLACEMENT IN A LINEAR RUNTIME

(75) Inventors: Ronald Miller, San Francisco, CA (US); William C. Naylor, San Jose, CA (US); Yiu-Chung Wong, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 736 days.

This patent is subject to a terminal disclaimer.

(21) Appl. No.: 12/140,146

(22) Filed: Jun. 16, 2008

(65) Prior Publication Data

US 2008/0250375 A1 Oct. 9, 2008

Related U.S. Application Data

(63) Continuation of application No. 11/301,867, filed on Dec. 12, 2005, now Pat. No. 7,404,168, which is a continuation of application No. 09/976,960, filed on Oct. 11, 2001, now Pat. No. 7,036,103, which is a continuation of application No. 09/437,996, filed on Nov. 10, 1999, now abandoned.

(60) Provisional application No. 60/159,687, filed on Oct. 14, 1999.

(51) Int. Cl.
*G06F 17/50* (2006.01)
(52) U.S. Cl. .......................... 716/122; 716/123; 716/124
(58) Field of Classification Search ................... 716/122, 716/123, 124
See application file for complete search history.

(56) References Cited

U.S. PATENT DOCUMENTS

| | | | |
|---|---|---|---|
| 4,742,471 A | 5/1988 | Yoffa et al. | |
| 5,311,443 A | 5/1994 | Crain et al. | |
| 5,619,419 A | 4/1997 | D'Haeseleer et al. | |
| 5,682,321 A | 10/1997 | Ding et al. | |
| 5,726,903 A | 3/1998 | Kerzman et al. | |
| 5,798,936 A | 8/1998 | Cheng | |
| 5,801,959 A | 9/1998 | Ding et al. | |
| 5,818,729 A | 10/1998 | Wang et al. | |
| 5,825,661 A | 10/1998 | Drumm | |
| 5,903,461 A | 5/1999 | Rostoker et al. | |
| 5,963,455 A | 10/1999 | Scepanovic et al. | |
| 5,974,245 A | 10/1999 | Li et al. | |
| 6,014,506 A | 1/2000 | Hossain et al. | |
| 6,026,223 A | 2/2000 | Scepanovic et al. | |
| 6,080,201 A | 6/2000 | Hojat et al. | |
| 6,080,204 A | 6/2000 | Mendel | |

(Continued)

OTHER PUBLICATIONS

Koide et al. ("A new performance driven placement method with the Elmore delay model for row based VLSIs", Proceedings of the 1995 ASP-DAC Design Automation Conference, Aug. 29, 1995, pp. 405-412).

(Continued)

*Primary Examiner* — Phallaka Kik
(74) *Attorney, Agent, or Firm* — Bever, Hoffman & Harms, LLP; Jeanette S. Harms

(57) ABSTRACT

A detailed placement process which optimizes cell placement with up to one hundred percent densities in a linear run time. The output from a conjugate-gradient coarse placement process is input to the detailed placement process. A dynamic programming technique is used to optimize cell placement by swapping cells between two or more rows. The search space is pruned beforehand. A greedy cleanup phase using an incremental row placer is used. Thereby, the detailed placement process handles congestion driven placements characterized by non-uniform densities expeditiously and efficiently.

40 Claims, 28 Drawing Sheets

U.S. PATENT DOCUMENTS

| | | | |
|---|---|---|---|
| 6,086,631 | A | 7/2000 | Chaudhary et al. |
| 6,091,892 | A | 7/2000 | Xue et al. |
| 6,099,583 | A | 8/2000 | Nag |
| 6,155,725 | A | 12/2000 | Scepanovic et al. |
| 6,209,123 | B1 | 3/2001 | Maziasz et al. |
| 6,223,332 | B1 | 4/2001 | Scepanovic et al. |
| 6,230,304 | B1 | 5/2001 | Groeneveld et al. |
| 6,249,902 | B1 | 6/2001 | Igusa et al. |
| 6,282,693 | B1 | 8/2001 | Naylor et al. |
| 6,282,694 | B1 | 8/2001 | Cheng et al. |
| 6,286,128 | B1 | 9/2001 | Pileggi et al. |
| 6,292,929 | B2 | 9/2001 | Scepanovic et al. |
| 6,321,366 | B1 | 11/2001 | Tseng et al. |
| 6,360,356 | B1 | 3/2002 | Eng |
| 6,370,673 | B1 | 4/2002 | Hill |
| 6,378,114 | B1 | 4/2002 | Shenoy et al. |
| 6,381,731 | B1 | 4/2002 | Grodd |
| 6,385,758 | B1 | 5/2002 | Kikuchi et al. |
| 6,442,743 | B1 | 8/2002 | Sarrafzadeh et al. |
| 6,446,239 | B1 | 9/2002 | Markosian et al. |
| 6,449,761 | B1 | 9/2002 | Greidinger et al. |
| 6,553,338 | B1 | 4/2003 | Buch et al. |
| 6,594,811 | B2 | 7/2003 | Katz |
| 6,671,859 | B1 | 12/2003 | Naylor et al. |
| 6,701,289 | B1 | 3/2004 | Garnett et al. |
| 6,756,242 | B1 | 6/2004 | Regan |
| 6,961,916 | B2 | 11/2005 | Sarrafzadeh et al. |
| 6,971,080 | B2 | 11/2005 | Grodd |
| 7,065,729 | B1 | 6/2006 | Chapman |
| 2001/0003843 | A1 | 6/2001 | Scepanovic et al. |
| 2001/0010090 | A1 | 7/2001 | Boyle et al. |
| 2002/0059553 | A1 | 5/2002 | Eng |
| 2002/0138816 | A1 | 9/2002 | Sarrafzadeh et al. |
| 2004/0107408 | A1 | 6/2004 | Sano et al. |

OTHER PUBLICATIONS

Kahng et al. ("Optimization of linear placements for wirelength minimization with free sites", Proceedings of the ASP-DAC '99 Asia and South Pacific Design Automation Conference, Jan. 18, 1999, vol. 1, pp. 241-244).

Chin et al. ("Interior point methods for placement", 1994 IEEE International Symposium on Circuits and Systems, ISCAS '94, vol. 1, May 30, 1994, pp. 169-171).

Venkateswaran et al. ("Clock-skew constrained placement for row based designs", Proceedings of 1998 International Conference on Computer Design: VLSI in Computers and Processors, Oct. 5, 1998, pp. 219-220).

Chowdhury ("Analytical approaches to the combinatorial optimization in linear placement problems", IEEE Transactions on Computer-Aided Design of Integrated Circuits and Systems, vol. 8, No. 6, Jun. 1989, pp. 630-639).

Yang et al. ("HALO: an efficient global placement strategy for standard cells", IEEE Transactions on Computer-Aided Design Integrated Circuits and Systems, vol. 11, No. 8, Aug. 1992, pp. 1024-1031).

Hamada et al. ("An efficient multilevel placement technique using hierarchical partitioning ", IEEE Transactions on Circuits and Systems I: Fundamental Theory and Applications, vol. 39, No. 6, Jun. 1992, pp. 432-439).

Kim et al. ("Combined hierarchical placement algorithm for row-based layouts", Electronics Letters, vol. 29, No. 17, Aug. 19, 1993, pp. 1508-1510).

Doll et al. ("Iterative placement improvement by network flow methods", IEEE Transactions on Computer-Aided Design of Integrated Circuits and Systems, vol. 13, No. 10, Oct. 1994, pp. 1189-1200).

Tsay et al. ("A row-based cell placement method that utilizes circuit structural properties", IEEE Transactions on Computer-Aided Design of Integrated Circuits and Systems, vol. 14, No. 3, Mar. 1995, pp. 393-397).

Hossain et al. ("A new faster algorithm for iterative placement improvement", Proceedings of Sixth Great Lakes Symposium on VLSI, Mar. 22, 1996, pp. 44-49).

Tianming et al. ("VEAP: Global optimization based efficient algorithm for VLSI placement", Proceedings of the 1997 ASP-DAC Asia and South Pacific Design Automation Conference, Jan. 28, 1997, pp. 277-280).

Koide et al. ("Par-POPINS: a timing-driven parallel placement method with the Elmore delay model for row based VLSIs", Proceedings of the ASP-DAC '97 Asia and South Pacific Design Automation Conference, Jan. 28, 1997, pp. 133-140).

Kleinhans et al. ("GORDIAN: VLSI Placement by Quadratic Programming and Slicing Optimization", IEEE Transactions on Computer-Aided Design, vol. 10, No. 3, Mar. 1991, pp. 356-365).

Lee et al. ("A flexible clustering and floor planning approach to standard cell placement using hierarchical simulated annealing" Proceedings of the 1991 International Conference on Circuits and Systems, vol. 2, Jun. 16, 1991, pp. 882-885).

NN86044981, "Timing-Influenced Layout Design", IBM Technical Disclosure Bulletin, Apr. 1986, vol. 28 No. 11, pp. 4981-4987 (11 pages).

NN881174, "Placement-Preserving Timing Adjustment for Very Large-Scale Integrated Circuits", IBM Technical Disclosure Bulletin, Nov. 1988, vol. 31,No. 6, pp. 74-77 (5 pages).

NA9003341, "CPLACE: A Standard Cell Placement Program", IBM Technical Disclosure Bulletin, vol. 32, No. 10A, Mar. 1990, pp. 341-342 (5 pages).

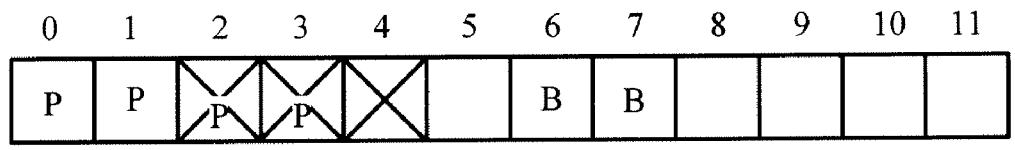
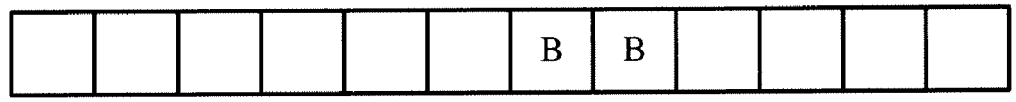
Offset = 0, Gaps = 5, x1/x2 = 7
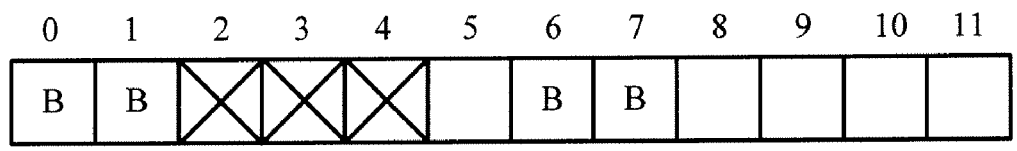
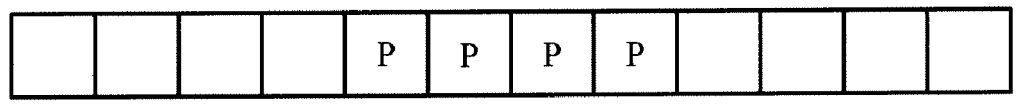
Offset = 0, Gaps = 5, x1/x2 = 8
Figure 17

Figure 20  Before Detailed Placement

DETAILED PLACER FOR OPTIMIZING HIGH DENSITY CELL PLACEMENT IN A LINEAR RUNTIME

RELATED APPLICATIONS

This application is a continuation of U.S. patent application Ser. No. 11/301,867, entitled "Detailed Placer For Optimizing High Density Cell Placement In A Linear Runtime" filed Dec. 12, 2005 which is a continuation of U.S. patent application Ser. No. 09/976,960, entitled "Detailed Placer For Optimizing High Density Cell Placement In A Linear Runtime" filed Oct. 11, 2001 which is a continuation of U.S. patent application Ser. No. 09/437,996, entitled "Detailed Placer For Optimizing High Density Cell Placement In A Linear Runtime" filed Nov. 10, 1999 which claims priority of U.S. Provisional Application 60/159,687, entitled "Detailed Placer For Optimizing High Density Cell Placement In A Linear Runtime" filed Oct. 14, 1999.

FIELD OF THE INVENTION

The present invention relates to the field of electronic design automation (EDA). More specifically, the present invention relates to techniques for cell placement and other optimizations used in the design and fabrication of integrated circuit devices.

BACKGROUND OF THE INVENTION

The rapid growth in the complexity of modern electronic circuits has forced electronic circuit designers to rely upon computer programs to assist or automate most steps of the design process. Such a design is much too large for a circuit designer or even an engineering team of designers to manage effectively manually. Hence, circuits are almost always designed with the aid of an electronic design automation (EDA) system. Basically, an EDA system is a computer software system used for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated into a lower level technology-specific netlist based on a technology-specific library that has gate-specific models for timing and power estimation. A netlist describes the IC design and is composed of nodes (elements) and edges, e.g., connections between nodes, and can be represented using a directed acyclic graph structure having nodes which are connected to each other with signal lines. A single node can have multiple fan-ins and multiple fan-outs. The netlist is typically stored in computer readable media within the EDA system and processed and verified using many well known techniques. One result is a physical device layout in mask form which can be used to directly implement structures in silicon to realize the physical IC device.

The process used to automate the design of electronic circuits entails first producing a high-level description of the circuit in a hardware description language such as Verilog or VHDL. Next, this high-level description is converted into a netlist using a computer implemented synthesis process, such as the "Design Compiler" by Synopsys of Mountain View, Calif. A netlist is a description of the electronic circuit which specifies what cells compose the circuit and which pins of which cells are to be connected together using wires ("nets"). Importantly, the netlist does not specify where on a circuit board or silicon chip the cells are placed or where the wires run which connect them together. Determining this geometric information is the function of an automatic placement process and an automatic routing process, both of which are typically computer programs.

Next, the designer supplies the netlist into the computer implemented automatic cell placement process 1. The automatic placement computer program finds a location for each cell on a circuit board or silicon chip. The locations are specified, typically, in two dimensional spatial coordinates, e.g., (x,y) coordinates, on the circuit board or silicon chip. The locations are typically selected to optimize certain objectives such as wire length, wire routability, circuit speed, circuit power consumption, and/or other criteria, subject to the condition that the cells are spread evenly over the circuit board or silicon chip and that the cells do not overlap with each other. The output of the automatic cell placement process includes a data structure including the (x,y) position for each cell of the IC design. Often, the netlist is modified and a new netlist is generated.

Thereupon, the designer supplies the netlist and the cell location data structure, generated by the placement program, to a computer implemented automatic wire routing process. This computer program generates wire geometry within data structure. The wire geometry data structure and cell placement data structure together are used to make the final geometric database needed for fabrication of the circuit as shown by process.

And because circuits today contain hundreds of thousands or even millions of individual pieces or "cells," placement is done in two steps: a first coarse placement process, followed by detailed a placement process. The coarse placement process assigns a general location for each of the cells (not necessarily legal) within a given boundary and contains interconnect information for connecting the various cells. When selecting the locations of cells, on the one hand, it is desirable to spread cells evenly across the silicon chip or circuit board in order to avoid localized congestion and heat buildup. But on the other hand, it would be desirable to pack cells as tightly as possible in order to minimize wire length, improve speed, and reduce the die size. It is the function of the detailed placement process to take the data structure output by the coarse placement and generate a more detailed placement. (more detailed in the sense that more information is considered such as legal sites). More specifically, the detailed placement process ensures that no cells overlap and that all cells are eventually placed in locations which are located on legal sites. Furthermore, the detailed placement process attempts to optimize the placement of the cells according to desired metrics (e.g., higher density, tighter timing, etc.). Congestion driven placers often leave areas of chip at near 100% density.

One problem encountered with placement in general is that there are virtually countless different ways by which the cells of a given circuit can be arranged. As a result, the task of finding the optimal placement is quite daunting. A course placement and detailed placement process can be run for quite some time in trying to continually optimize a design, with minimal improvements. Eventually, a point of diminishing returns is reached. Another general problem is that course placement and detailed course placement processes have greater difficulty in placing cells at higher densities. Many prior art placement processes simply break down when requested to place cells above certain density levels. In other words, they cannot find solutions exceeding a certain density threshold. Some prior art placement processes can find a high density solution only after running for a significant amount of time or only after an expert human designer "tweaks" the placement. This is disadvantageous as it delays time-to-market and also increases costs.

Accordingly, what is needed is a faster, more efficient placement process. In view of the above needs, the present invention provides a novel cell placement system for increasing the efficiency of an IC design process and which is capable of placing cells with up to 100% density. These and other advantages of the present invention not specifically mentioned above will become clear within discussions of the present invention presented herein.

SUMMARY OF THE INVENTION

The present invention pertains to a detailed placement process which optimizes cell placement with up to one hundred percent densities in a linear run time. In one embodiment, the output from a conjugate-gradient coarse placement process is input to the detailed placement process. A dynamic programming technique is then used to optimize cell placement by swapping cells between two or more rows. The search space is pruned beforehand, and cells are snapped to one of the two rows. In another embodiment, a greedy cleanup phase using an incremental row placer is used. The incremental row placer judiciously places cells in a single row. The dynamic programming technique works well at optimizing cell placement when dealing with high density situations, and the greedy cleanup phase with the incremental row placer expeditiously optimizes the low density situations. Thereby, the detailed placer of the present invention handles congestion driven placements characterized by non-uniform densities very quickly and efficiently.

BRIEF DESCRIPTION OF THE DRAWINGS

The present invention is illustrated by way of example, and not by way of limitation, in the figures of the accompanying drawings and in which like reference numerals refer to similar elements and in which:

FIG. 17 shows how cells that overlap are broken down.

DETAILED DESCRIPTION

Figure 1:
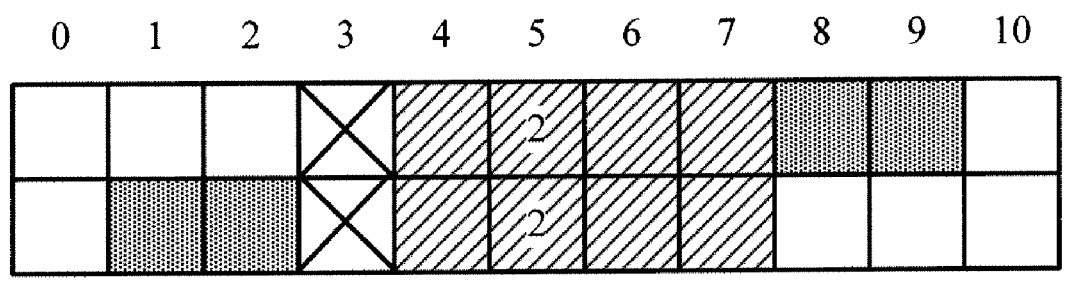
FIG. 1 shows an example whereby sorted x-attracts lead to a suboptimal placement.

An improved placement process is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

When creating a layout for a given netlist, the present invention utilizes two phases: a first phase coarse placement process and a second phase detailed placement process. The first phase creates a placement using floating point numbers for the cell locations. This placement ignores many of the details, such as the exact site locations that the cells must map to, and generally creates a placement with a certain amount of overlapping cells. In the currently preferred embodiment of the present invention, the first phase utilizes a method to generate coarse or approximate placement of cells on a 2-dimensional silicon chip or circuit board. The coarse placer can also be used to automatically size cells, insert and size buffers, and aid in timing driven structuring of the placed circuit. The coarse placer can be used in conjunction with other automatic design tools such as a detailed placer and an automatic wire router.

In one embodiment, the first phase coarse placement process can be implemented as a computer program that uses general unconstrained non-linear optimization techniques to find a coarse placement of cells on a circuit board or silicon chip. A master objective function (MOF) is defined which evaluates the goodness of a particular cell placement. A non-linear optimization process finds an assignment of values to the function variables which minimizes the MOF. The MOF is chosen so that values of variables which minimize the MOF correspond to a good coarse placement.

In particular, the MOF is a weighted sum of functions which evaluate various metrics. An important metric for consideration is the density metric, which measures how well spread out the cells are in the placement. Other component functions are wire-length, which measures total linear wire-length, delay, which measures circuit timing, and power, which measures circuit power consumption. The barrier metric penalizes placements with cells outside the allowed placement region.

In the currently preferred embodiment, the conjugate-gradient process utilizes both the MOF and its gradient to determine a next cell placement. In the preferred embodiment, the gradient of the MOF is also implemented as a computer program subroutine. The gradient is the vector of partial derivatives of the MOF with respect to all variables. The non-linear optimization process calls the MOF and gradient function subroutines and uses the results to minimize the MOF. A smoothing variable, alpha, is used to alter the MOF through multiple passes of the conjugate-gradient process where alpha is altered on each pass until the process terminates or convergence is reached.

In one implementation, the variables of the optimization are the (x and y) coordinates of all of the cells to represent 2-dimensional placement. The result is a placement of cells. In other embodiments, adding variables to represent other parameters of the circuit implementation combine additional optimizations with placement. One such additional variable within the present invention is cell size. Adding a variable for each cell size gives simultaneous placement and cell sizing. Adding a variable to each wire branch for buffer area gives simultaneous placement and buffer insertion. Adding a variable to each wire branch for buffer tree depth gives simultaneous placement and buffer tree balancing. Timing-driven structuring of fanout-free-trees can be modeled by adding a variable to each input of the fanout-free-tree to represent the depth of that input of the tree. The coarse placement process is described in more detail in the patent application entitled, "Non-Linear Optimization System And Method For Wire Length And Density Within An Automatic Electronic Circuit Placer," filed Dec. 16, 1998, Ser. No. 09/216,664, U.S. Pat. No. 6,282,693 B1 and assigned to the assignee of the present application and which is incorporated by reference in its entirety herein.

A second phase is then undertaken to snap the cells from the floating point x/y coordinates generated by the first phase, to the nearest legal location and to resolve issues, such as the overlapping cells. Typical prior art process uses the initial x/y coordinates as a seed for the legalization of the placement and then continue to try and optimize the global cost function, such as reducing the total wire length. However, in the present invention, the detailed placer yields placements such that it is possible to achieve high quality results by snapping the cells to their nearest legal location.

This allows for a much simpler implementation of detailed placement, as there is only a single cost function that is localized to each individual cell and is well defined. It should be noted that other extensions, such as wire lengths, can be taken into account in the optimization process as well. In addition to minimizing the displacement of the cells from their attract point, the detailed placer needs to ensure that each cell is on a legal location.

There are several assumptions that the detailed placer makes about the characteristics of the physical block being placed. First, it is assumed that the block is rectangular with M horizontal rows, each with N sites. Each of these sites is exactly the same width, and the spacing between sites is constant. To simplify the API, physical units are normalized to the width of a site with each site having a width of one. The rows are allowed to have a user-specified spacing between them and therefore do not have to be uniform. The caller of the detailed placer API is allowed to specify a callback function that indicates whether or not a cell is legal on a specific site or in an entire row.

The process that is used during the detailed placer in the present invention is now described. The processor handling blockages and power straps/pre-routes are also described. The current flow of the detailed placer of the present invention involves numerous novel improvements that are used to perform various optimizations on the placement. In order to make the problem more tractable, one assumption is made for the majority of these optimizations. That assumption is that cells within a single row will generally be sorted by their x-attract location. For the case of rows with no blockages, power-straps, or other types of site typing, the optimal solution will always have the cells sorted in this manner.

When blockages and cell-legality issues put restrictions on where cells can be placed within a block, this assumption breaks down. FIG. 1 shows a case where sorted x-attracts leads to a sub optimal placement. The numbers represent the "center-of-gravity" attract point for the cells, and the X is a blocked site. Without any blockages, the shaded cells 4-7 would be pushed over to the far left and the black cells 8-9 would butt immediately to its right. However, since cells 4-7 will not fit into the leftmost space, it was forced to jump past several empty sites 0-3 and sit at the right side of the blockage 3. With the cells sorted on x-location, the black cell has no choice but to sit on the right side of the shaded cell. However, a better solution is the one shown underneath where the black cells are placed in the empty sites that the shaded cell wouldn't fit inside. In rows that are filled near 100% capacity, this kind of swapping is often necessary to even achieve a solution.

The core process inside of the detailed placer of the present invention is based upon a dynamic programming row-swapping technique. This requires all of the cells to be placed into rows initially, and then takes pairs of these rows and performs row swaps between them. All of these cells are removed from both of the rows being optimized, and are then replaced in the rows while minimizing the cost function. Before being placed in the rows, the cells are combined into one list and then sorted by their x-attract location. Each cell is then placed into the rows one at a time, starting with the ones with the lowest x-attract location.

Figure 2:
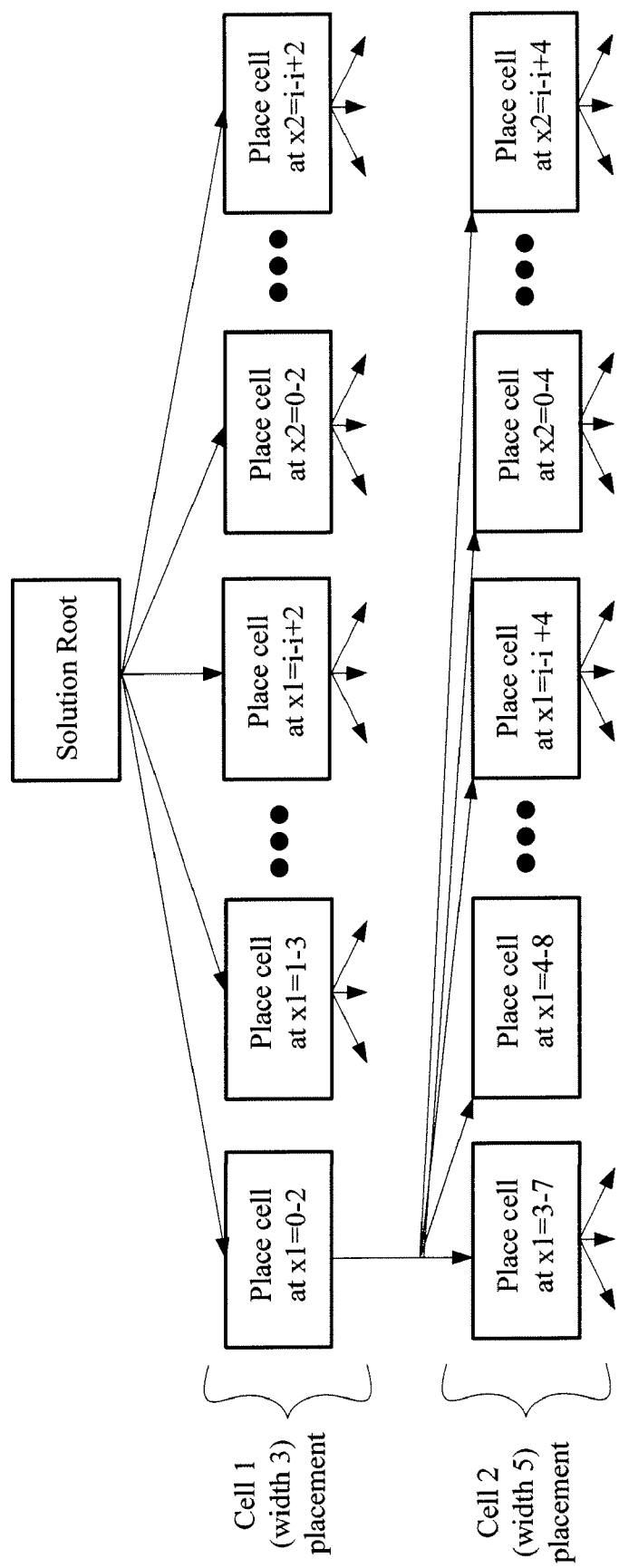
FIG. 2 shows an exemplary solution tree.

In the general case, when the first cell is placed, a solution is kept for each legal site that the cell can be placed in within each row (although always placing the cell to the right of any cells that have already been placed.) Each successive cell then starts from all of the existing solutions and from each of these solutions, a new batch of solutions will be generated. It should be noted that without pruning, this process is xponential, so the success of the algorithm depends on how well the search space is pruned. FIG. 2 shows an exemplary search tree (where x1/x2 are the locations within row1/row2 that a cell is being placed in).

Figure 3:
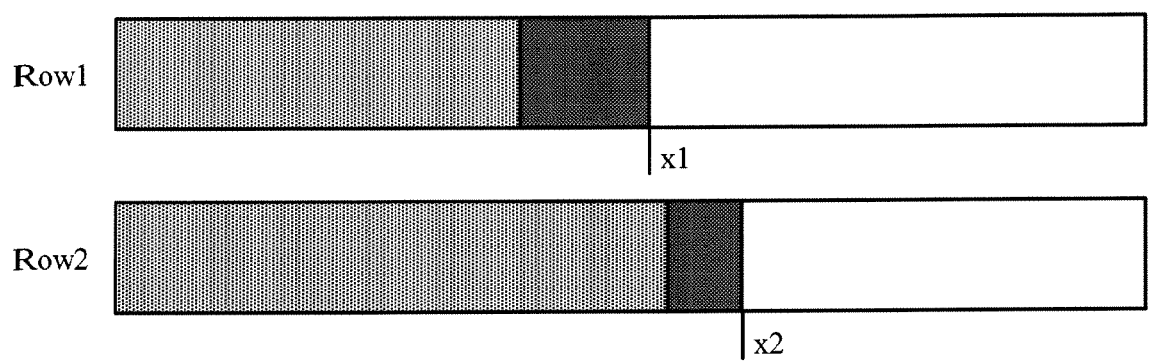
FIG. 3 shows a partial solution during full row swapping.

Consider the partial solution shown in FIG. 3, which could be one of the boxes described above after half of the cells have been placed. Given the assumption mentioned above, (that the cells within a row are always placed in sorted x-attract order,) one can observe that new cells being added will always be placed to the right of the ones that are currently in the row. Consider the partial solution in the above two rows.

The dark area in the figure represents the rightmost cells of a particular solution, and the shaded area represents some combination of cells and empty sites that were places prior to the rightmost cells. When placing the new cells, it can be seen that the exact locations of the cells within the dark/shaded area in no way impacts the ability to place the cells in the white area. The dynamic programming technique used in the algorithm takes advantage of this property, and for a given partial solution of a grouping of cells with the same x1/x2 locations for the leftmost available sites, only the solution with the lowest cost needs to be kept. The solutions can then be stored in an array indexed by this x1/x2 location, and whenever a new solution maps onto the same location, only the better of the two is kept. The process will be able to find an optimal solution with a runtime that is quadratic in the size of the search space (and assuming that cells within a row are sorted by x-attract locations).

The above dynamic approach describes a method for optimizing the placement of cells within two rows, but it is an incremental approach that depends on a starting placement that is already legal. This still leaves the problem of coming up with an initial placement. The optimization of swapping cells between a pair of rows can do a very good job of optimizing the x-placement of cells, but doesn't help much if the cells are located a long ways from their y-attract point. Therefore, a good initial placement would be one that places the cells very close to their desired row placement, while ignoring the x-attract locations.

Figure 4:
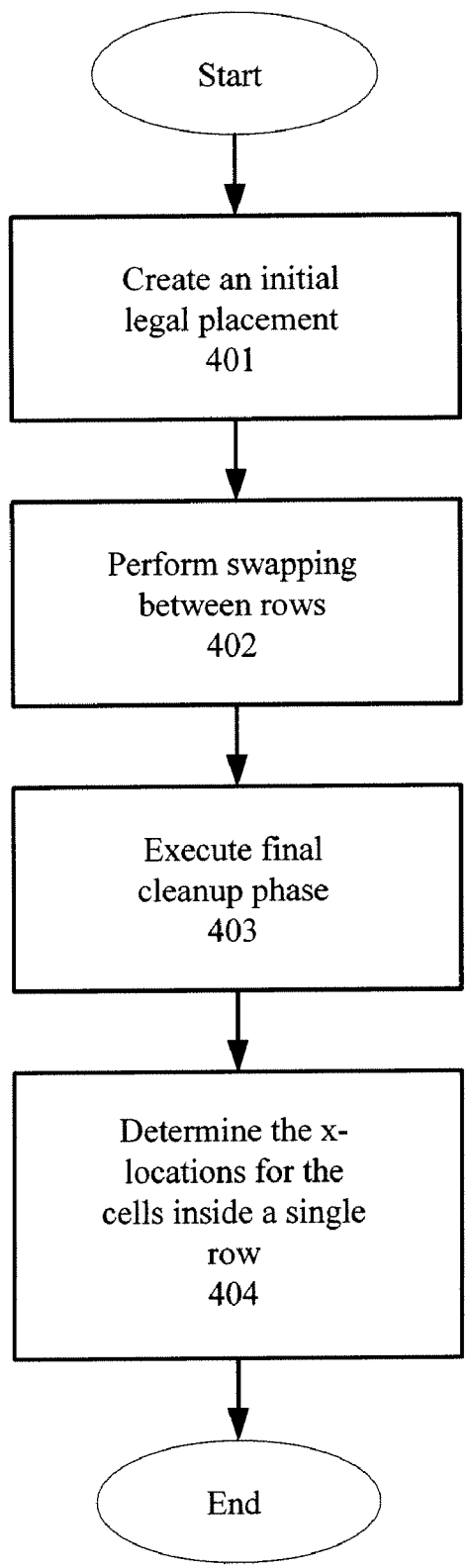
FIG. 4 is a flowchart describing the basic steps of the detailed placer.

The basic flow in the detailed placer is shown in the flow chart of FIG. 4. First an initial legal placement optimized on y-attract locations is created, step 401. The definition of legal with regards to this initial placement is that no row has more cells than there are sites available. This does not guarantee a fully legal placement since the presence of blockages and site legality issues may still mean that some sites will not be able to be filled. The assumption is that the dynamic programming phase will take care of these issues. Next, perform swapping between the rows using dynamic programming to optimize x locations, step 402. In step 403, the final greedy clean-up phase is executed. And then the x-locations for the cells inside a single row is finally determined in step 404.

A high level description of the data structures used in the present invention is now disclosed. In the absence of blockages, the row data structure points to all of the cell that are contained in the row along with some other book keeping information (e.g., how many sites are in the row and how many are filled). With blockages, things become slightly more complicated. At this point, it is worth nothing that there are two separate ways that blockages are stored inside of the detailed placer. One method breaks a row into two separate rows, while the other keeps the row as a single unit and simply marks the sites in the row that are blocked off. The former is referred to within the code as an "opaque" blockage, while the latter is referred to as "non-opaque".

Figure 5:
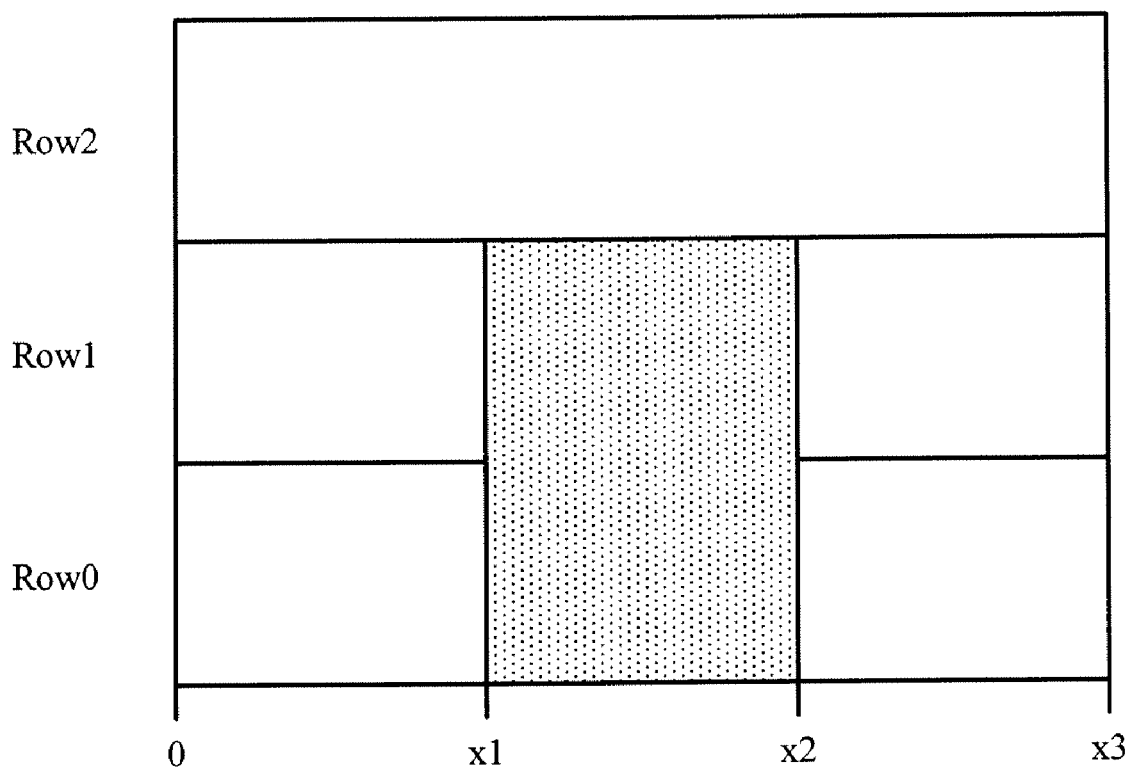
FIG. 5 shows an example of an opaque blockage.

With opaque blockages, a row is broken up into subrows, with all subrows for a particular physical row being stored as a linked list. The non-opaque blockages are indicated inside of the row data structure by setting the appropriate bits in a "by" or bit-vector data structure. An example is shown in FIG. 5. Row2 would be treated as a single row with sites from location 0 to x3 and a NIL next pointer. When accessing row1, however, it would be seen as a row with sites from location0 to location x1, and its next pointer would point to a second subrow with sites from x2 to x3. In this example, if the blockage was not being treated as an opaque blockage, then row0, row1, and row2 would all look identical except that: 1) row0 and row1 would be marked as having less available sites to take into account the blocked sites, and 2) a bit-vector is stored on rows 0 and 1 to indicate which sites are blocked off and which sites are available.

Figure 6:
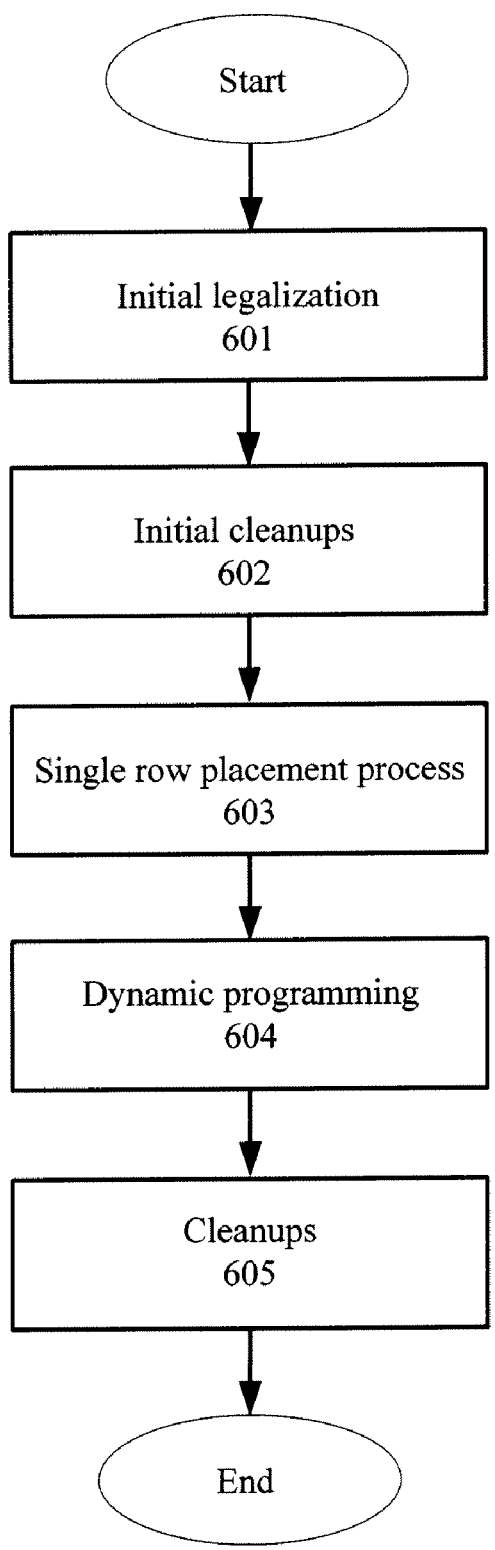
FIG. 6 shows a flow of the processes implemented in the detailed placer.

FIG. 6 is a flowchart describing the overall steps implemented in the detailed placer of the present invention. First, legalization is initialized, step 601. Likewise, cleanups are initialized, step 602. A single row placement process is then executed, step 603 Thereupon, a dynamic programming process is applied, step 604. Lastly, cleanups are performed, step 605. For initial legalization, the first step performed by the detailed placer of the present invention is to try and come up with an initial allocation of cells to rows such that none of the rows are over-capacity. In the simple case without blockages or cell legality restrictions on sites, this would also mean, by definition, a legal placement.

The approach that is used in the currently preferred embodiment of the present invention for allocating cells to rows is basically a greedy one with a little bit of lookahead. The coarse placer generally does a very good job of placing the cells in rows to begin with, so generally the majority of the cells can simply be placed in their desired row. The first step of the legalization is to put all of the cells into a queue that is sorted by y-attract point. The rows are then processed starting from row zero, and cells are popped off and placed into the rows. Before starting each row, a small amount of lookahead is performed. Some calculations are done to check how many sites are taken up by the cells that haven't been placed yet, as well as how many sites are left. This is then used to determine a minimum and maximum number of sites that must be placed in the row. The maximum number of sites for a row is generally the total number of sites in the row, with the exception of when there are power straps. In the case of power straps, we try not to fill rows to capacity since there will probably be empty spaces under at least some of the power strap area. This determination of a maximum capacity of sites for a row is arbitrary and will need tuning. See below for more information on power straps.

The calculation of a minimum number of sites is done to ensure that not all empty sites are put in the bottom rows and then being unable to place the cells legally in the upper rows. If the number is too small, the detailed placer may end up having trouble finding a legal placement. If the number is too big, cells may be forced into rows that they don't want to be placed in, which can create a bad starting placement that the further optimizations may never recover from. In the currently preferred embodiment of the present invention, each row is only allowed its own share of the number of empty sites, in addition to being allowed to take an extra 5% from the remaining pool of empty sites. With respect to blockages, the non-opaque blockages (i.e. the ones that are simply marked in the rows but do not actually break the rows into separate pieces) have no effect on the initial legalization other than the fact that the number of available sites on a row is decreased.

Opaque blockages, however, break rows into separate subrows. When these subrows are being placed, only cells that fall within the x-coordinate range of the subrow are considered. For example, if a subrow occupies sites from 127 to 346, a cell with an attract-point of 842 would not be placed inside that subrow. There are some further complications to this in the case where a cell falls in the middle of a blockage (i.e. between two subrows but not in either). In this case, the cell is placed in the subrow that it is the closest to. Anther scenario where this situation could not occur is when the area under a blockage is too dense, and all of the cells that wanted to go under the blockage didn't fit in the rows. In this case, the cell will be snapped to the nearest subrow and the later optimizations should be able to pull the cell back into the row that it wanted to snap to.

Figure 7:
FIG. 7 shows a cell being snapped to a subrow.

The example shown in FIG. 7 illustrates this scenario. If cell 701 did not get placed in row2, it would be stuck between rows and would not fit into either subrow for row3. However, as mentioned above, special case code looks for this scenario and snaps cell 701 into the nearest subrow of row3. While this would be a poor choice of placement for the cell, the following optimizations are very good at cleaning up after this.

With respect to power straps, there needs to be a factor applied to the minimum and maximum number of empty sites in a row when performing initial legalization. Basically, both of these numbers are fudged when there are power straps in the block that are not treated as full blockages. The number of empty sites that a row is allowed to use up is reduced to ensure that more empty space is left for the remaining rows.

The maximum number of sites that a row can be filled to starts out at 99%. After placing all of the cells in rows, a check is performed to determine how many of the rows are illegal while taking into account all legality issues. If more than 5% of the rows are illegal (taking into account actual placements and power strap restrictions), then the number of sites in row is reduced to 98% and the process is repeated. The assumption is that the row-swapping optimizations can easily fix 5% of the rows, but if the cost is much higher than that, a legal solution may never be found. The initial legalization phase is so fast (on the order of a second or two for 200K cells) that this iteration doesn't cost too much. This iteration continues until either an acceptable solution is found or the percentage of cells being allowed per row is equal to the density (at which point the cells are effectively evenly distributed between the rows and reducing this number would have no effect).

Figure 8:
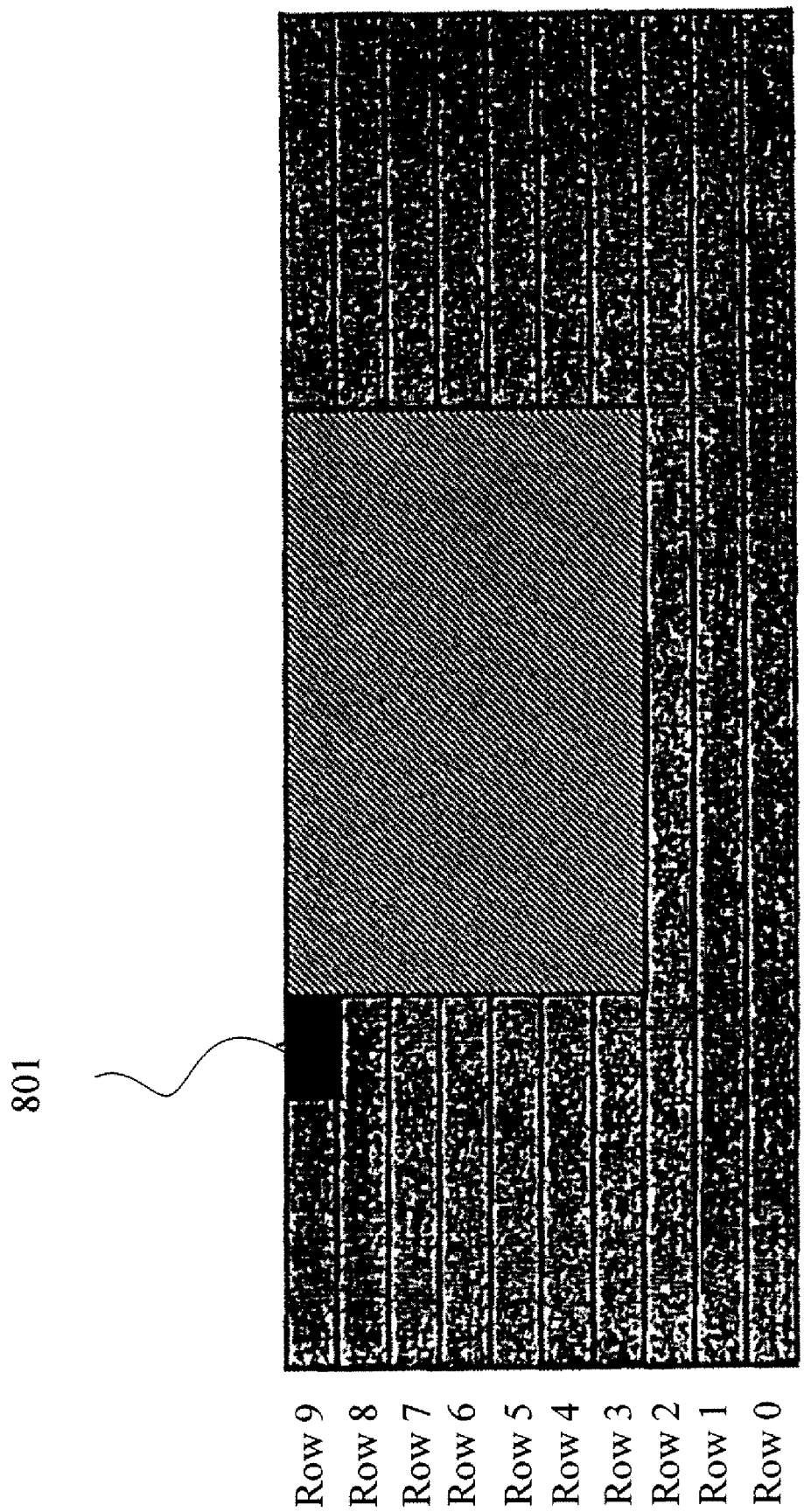
FIG. 8 shows a first clean-up phase used to ensure that none of the cells are far apart from their initial attract point.

The initial cleanups process is now disclosed. For fixing "distant" cells, the initial placement procedure described above generally does a very good job of creating a placement that is near optimal in terms of y-displacement. However, there are a few situations where some clean-up phases need to be run. The first clean-up phase that needs to be run is a simple quick pass over all of the cells to ensure that none of the cells are a long way away from their initial attract point. One situation where this can happen is shown in FIG. 8.

Figure 9:
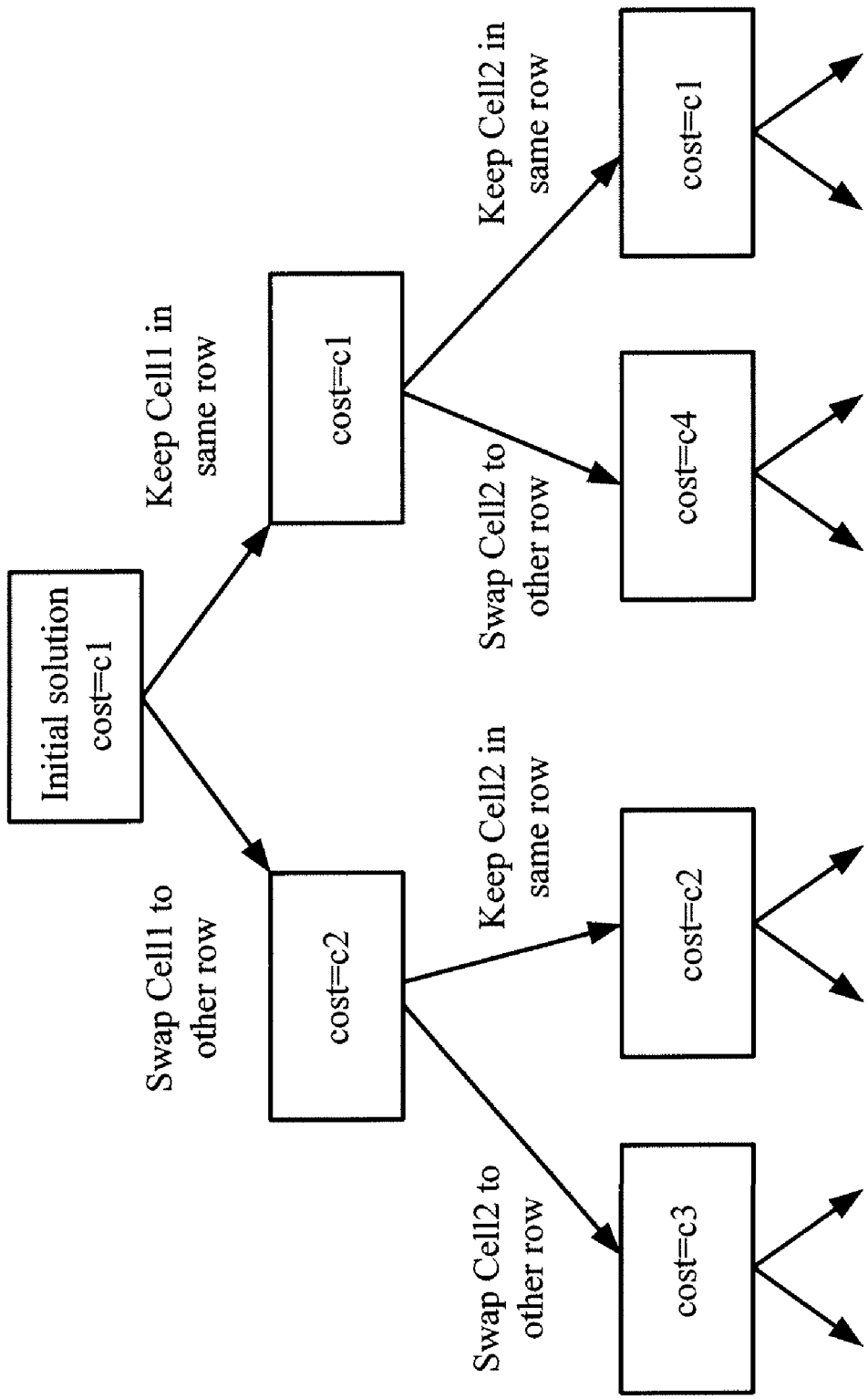
FIG. 9 shows a tree of solutions.

Because of the greedy nature of the row placement, FIG. 9 it is possible that by the time that row 9 is being filled, there are too many cells to fit in the left subrow. What will end up happening is the cell 901 will get left behind and then forced into the last subrow, a considerable distance from its attract point. To make things worse, the optimization phase of the detailed placement will not fix this since swapping between rows is only done for adjacent rows, and cells are not swapped across opaque blockages.

Hence, the first phase of the initial clean-ups is to look for cells that were placed in rows that are along ways away from their attract points. These cells are then just "jammed" in to whatever row their attract point is closest too, ignoring capacity for now. This will get fixed in the next phase of the initial clean-ups. For fixing over-capacity rows in high density testcases, or in other, strange situations that can occur due to blockage placement, it is possible that the above approach still leaves some rows filled over-capacity. When this happens, the technique that is applied is similar to taking a rolling pin, and trying to run it over the blocks, squeezing cells from over-capacity rows into rows that have space remaining.

The process loops both top down and bottom up over the rows with various lookaheads. The first pass over the block uses a lookahead of 1, and this lookahead is increased for each successive pass until a legal solution is found. As the rows are iterated over, only the ones that are illegal are considered as a starting point. Once an illegal row is found, swapping is performed with all rows up to "lookahead" rows away. Note that if the current loop is looking top-down, then only rows underneath the illegal row are considered. The idea is that if one starts from the top and work down, leaving legal rows, and making illegal rows legal without affecting any of the rows already visited, then a legal solution is likely to be obtained by the time the bottom of the block is reached.

An exemplary pseudo code for this approach is given below:

```
for lookahead = 1 to kl (an arbitrary termination point)
    /*Try bottom up first*/
    for m=num_rows-1 downto 0
        for n=1 to lookahead
            if (row_is_illegal(row(m))do_swaps(row(m), row(m-n))
        end
    end
    if(all_rows_legal( ))break
    /*Try top-down next*/
    for m=0 to num_rows-1
        for n=1 to lookahead
            if (row_is_illegal(row(m))do_swaps(row(m), row(m+n))
        end
    end
    if(all_rows_legal( ))break
end
```

In the currently preferred embodiment, a dynamic programming technique is applied to perform a certain number of swaps between each row. The basic approach is to start with the two rows filled with the cells that they currently contain, and then swap cells from one row to another to try and achieve a legal placement while minimizing the impact on the cost function. A queue is formed using each row where the cells are sorted by y-attract. The top row is sorted such that the cells with the lowest attract points (i.e. the ones most likely to want to be pushed down) are first in the queue, while the bottom row is sorted the opposite way.

The process then basically starts popping cells off of each queue and keeps track of the solutions with the cell in each row. This basically creates a tree of solutions as depicted in FIG. 9. As can be seen, this process is exponential, and some pruning is necessary. The pruning that is done here is very similar to the technique described above for the dynamic programming algorithm for swapping between rows. Since the ordering of the cells within a row is not considered, and the cost of each cell is not impacted by the placement of any other cell, all solutions with a given offset between the rows can be considered equal starting points. Note that the offset is defined as the number of sites filled in row2 subtracted from the number of sites filled in row1.

Another way of phrasing this is that at each row in the above tree, only the best solution with a given offset needs to be considered. To better illustrate this, consider the following example. To start out with, row1 has 98 out of 100 sites filled, while row2 has 101 out of 100 sites filled. As mentioned above, the offset is defined as the number of sites in row1 minus the number of sites in row2. This leaves a starting offset of negative three. To seed the solution, an array of all offsets that will be considered as intermediate solutions is created, and the initial solution is inserted at location negative three.

Figure 10:
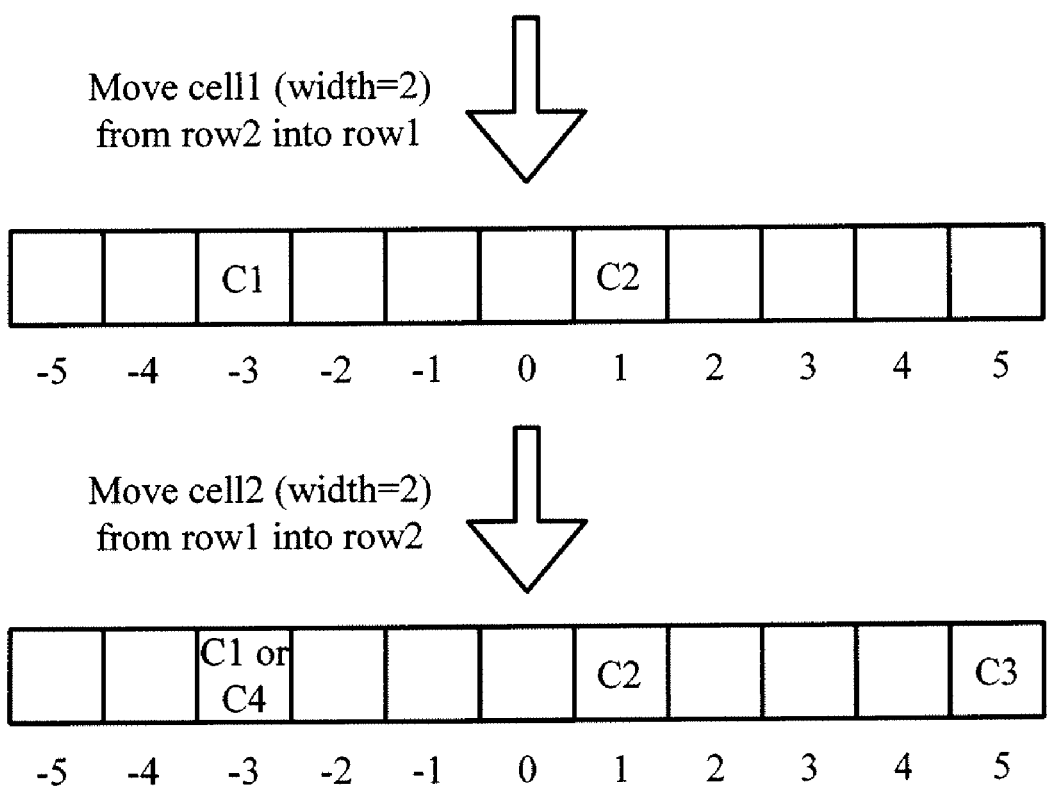
FIG. 10 shows a case whereby cells are popped from rows.

The cells are then popped off, starting from the queues for each row alternately. For each cell, all solutions that exist in the search space is considered, (each of which will be a different solution, but all of which contain the cell in its original row). The cost and the offset is updated to represent the cell having been swapped from one row to another, and the new spot is found within the offset array. If the solution is out of the bounds of the search space array, it is thrown away. If it maps to a position in the array that already contains a solution with the best cost is kept and the other is thrown out. To further illustrate in FIG. 10, consider the offset array after one cell has been popped off from each row. A cell from row2 is popped off first with a width of 2 sites, and then a cell from row1 is popped off, also with a width of 2.

Note that when the second cell is swapped, the condition where both cells are swapped rows as indicated by C4 maps back onto an offset of −3. At this point, only the solution with the best cost is kept. After all of the swaps have been attempted, the lowest cost solution within the range of the desired offsets is kept. The choice of the desired offsets in this case is carefully done to achieve the "rolling pin" effect mentioned above. If the swaps are being performed top down, then the choice of desired offsets is the "most legal" one that leaves the top row legal. Only solutions that make the top row legal are considered. In the above example, the goal is to make row2 legal, so only swaps>=−1 are considered. The best legal solution is chosen first (i.e. the one with the lowest cost and an offset that leaves both rows legal in this case between −1 and +1. If no solution exists in this rage, the solution is chosen that leaves row2 legal and row1 as close to legal as possible. In this testcase, the closest solution>+1 is kept.

To optimize legal placement, a final step that is performed when generating this initial placement is to clean up after the greedy phase with a smarter algorithm that minimizes the y-displacement of the cells. This approach uses the dynamic programming technique described above to swap cells between the rows, keeping the best solution with a legal offset. The number of swaps for this approach is pruned a little heavier than above since only the cells at the top of their respective queues are likely to want to swap. In many instances, this part of the optimization is unnecessary. The combination of the good placements that come out of the coarse placer with the greedy approach described above generally yields a near optimal cell placement in terms of y-displacement only. However, this optimization is quite fast and can potentially recover from mistakes that were made in the previous phases.

In disclosing the single row placement process, it is appropriate to describe processes for placing cells within a single row. While the dynamic programming row swapping technique results in optimal row placements for both rows in the absence of pruning, the pruning that is done on its search space means that this optimal solution is rarely found. However, it is a much easier problem to simply take a single row and to come up with the best placement of the cells within that row. There are two approaches to placing the cells within rows that are used inside the detailed placer. As described above, in order to keep the problem tractable, neither of the approaches considers solutions where the cells are not sorted by x-attract location.

The first approach is one where cells are put into a row one at a time, and are snapped to their desired attract point. If the location is empty, the cell is simply added. However, if the cell overlaps other cells, these cells are lumped into a single clump that is treated like a super cell within an attract point that is a weighted sum of the attract points of the other cells in the clump. The clumps are stored in a tree structure (with cells sitting at the leaves of the tree) and a single super-clump located at the root of the tree. As clumps bump into each other, they form merged clumps. When the final cell has been added, the cells will be located in their optimum locations. This approach is very fast, and has the added advantage that it is well suited to incremental optimizations. It is easy to take a cell out of row, and only the clumps above it in the tree need to be modified. Adding a cell is similarly easy.

A second approach for placing cells handles the cases of blockages and cell legality issues, while losing the incremental behavior of the previous approach. The process involves three passes over the cells. The first pass starts from the cell with the smallest x-attract location, and places it in the first legal position in the row. Successive cells are added to the rows, always in their leftmost legal position. This provides a legal solution to start with. Note that this call by itself is a quick "row is legal" check that is used by the detailed placer. The next pass starts from the right side of the row, and takes each cell and moves it as far to the right as it can legally move, without moving to the right of its attract point. This leaves a solution where the cells are sitting as far as possible to the right without any of the cells sitting to the right of their desired attract point.

The final pass starts with cells from the left. While the cell is to the left of its attract point, the cell is incrementally moved one site to the right. If it bumps into another cell, then that cell is moved one to the right, etc. While recursing and moving successive cells to the right, the process is immediately stopped when the delta of the cost of the solution becomes positive and all cells get put back into their position. If a cell is shifted that doesn't bump into another cell, and the delta to the cost is negative, that solution is accepted. As soon as the cell being shifted reaches its attract point, or when the shift fails due to a positive delta to the cost function, then that cell is now in its optimal location and we are move on to the next cell.

An exemplary pseudo code for implementing the single row placement process is shown below:

```
for each cell
    while (cell-> actual_x<cell->attract_x)
        if(! shift_cell_to_right(cell,0,cell->actual_x+1))break
    end
end
subroutine shift_cell_to_right(cell,cost,x)
    cost=cost+delta_cost;
    if(cost>0) return(FALSE)
    next_cell=find_cell_at_location(x+cell->width);
    if(next_cell==NIL)
        cell->actual_x=x
        return(TRUE)
    end
    if(shift_cell_to_right(next_cell,cost,x + cell-> width))
        cell->actual_x=x
        return(TRUE)
    else
        return(FALSE)
    end
end
```

Figure 11:
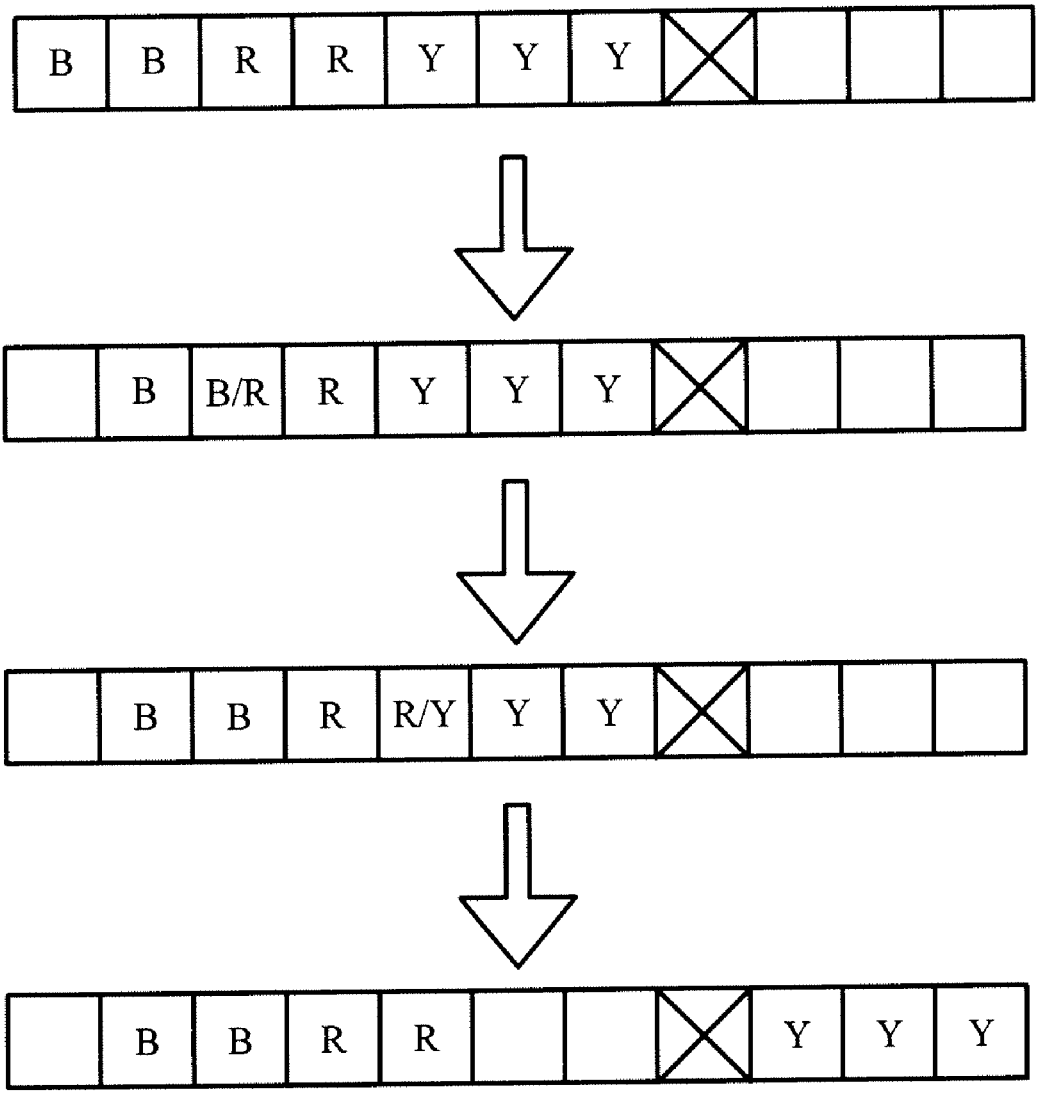
FIG. 11 shows a case whereby a cell is forced to move multiple sites due to cell legality issues.

It is clear to see that in the case of blockages or power straps, it is easy to check legality issues in each of the three passes. The one complication to the above process occurs when a cell is forced to move multiple sites due to cell legality issues. Consider the example shown in FIG. 11.

Notice how the blue cell is shifted on top of the red cell which is in turn shifted on top of the yellow cell. When the yellow cell tries to shift to the right, it must shift 4 sites in order to find a legal location. At this point, the cost of doing the shift may be prohibitive, and it would seem logical to stop the shift. However, if the blue and the red cells still want to shift further to the right, they need to do so before throwing away the solution. It may be the case that the solution as seen in the last row above is worse than the top row, however, the solution with the blue and red cells shifted right up against the blockage may be the optimal solution.

Figure 12:
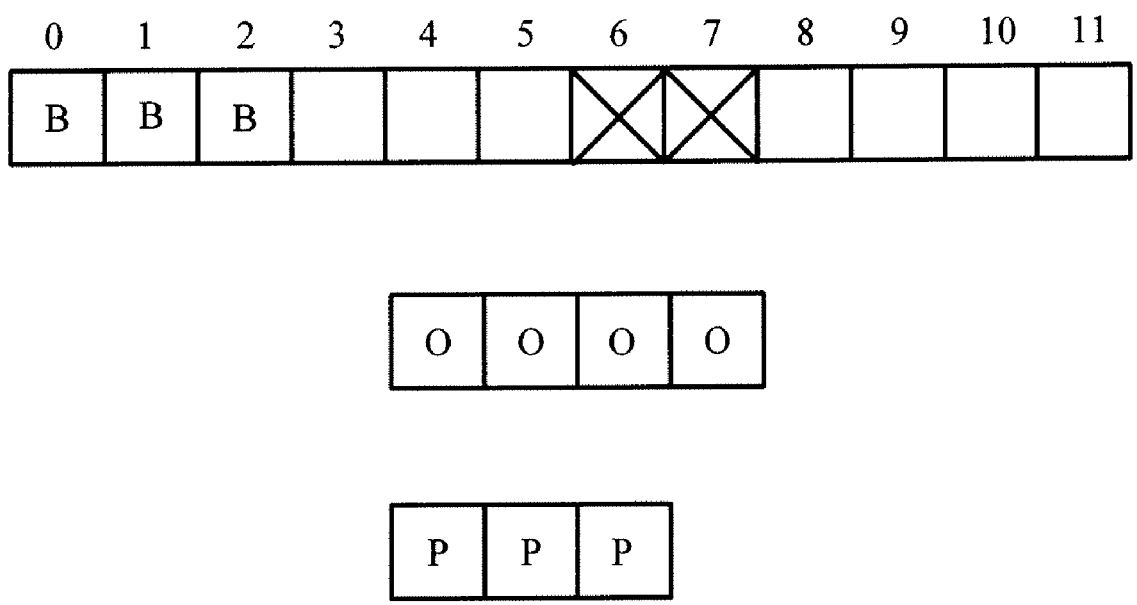
FIG. 12 shows a row filled to 100% capacity.

As discussed above, both of these approaches are used inside the detailed placer, although it is the second approach that gets the bulk of the usage. The first approach is used during the greedy clean-up phase whenever possible due to its incremental nature. That usage will be described in more detail in the description of the greedy clean ups below. One additional feature of the row-placer is that in one embodiments, it does a very limited attempt to make rows legal by swapping cells to break their sorted ordering. The basic approach is to keep track of the number of available gaps in a row, and decrement this count as gaps get placed. This is done during pass1 of the row placement where the cells are being placed in their leftmost legal position. Consider the example shown in FIG. 12.

This row is filled to 100% density, and therefore the number of available gaps is zero. However, if the orange cell is placed, it will be forced into sites 8 through 11, leaving no room for the purple cell to be placed. The greedy approach kicks in when placing a cell in the next legal location forces the cell to shift past more empty sites than are available. In the above case, there are zero empty sites available, and placing the orange cell next would force three empty sites to be placed. When this situation occurs, the remaining cells are searched for a cell that would fit into this space without requiring more than the available number of empty sites. In this case, the purple cell fits nicely into the available space, so it is placed, followed by the orange cell, which leads us to a legal placement.

It may be possible that some earlier cells should have been swapped, even though at the time, there were enough empty sites to place them in their sorted order. This rule often kicks in when there are power straps or 2-high cells, although the row swapping algorithms try very hard to prevent situations like this. The dynamic programming process is now described in detail. The basic principles of the dynamic programming technique is to swap cells between rows.

The main improvement is to try to only keep track of the portion of the search space that is likely to lead to good solution. As described above, there was a 2-dimensional array of solutions that was kept to allow for all possible combinations of cells in each row. It is clear than many of these solutions are unlikely to ever lead to the optimal solution (for example, the location that represents one row being completely full while the other row is still empty). One thing to note about this row swapping algorithm is that one can only compare two solutions when they have had the exact same cells placed. With the dynamic programming technique described above to swap cells in order to minimize y-displacement, one always started with a complete solution. Given a solution and performing row swaps on cells, both the starting point and ending points were legal solutions (i.e. they had the exact same cells distributed between the rows).

Figure 13:
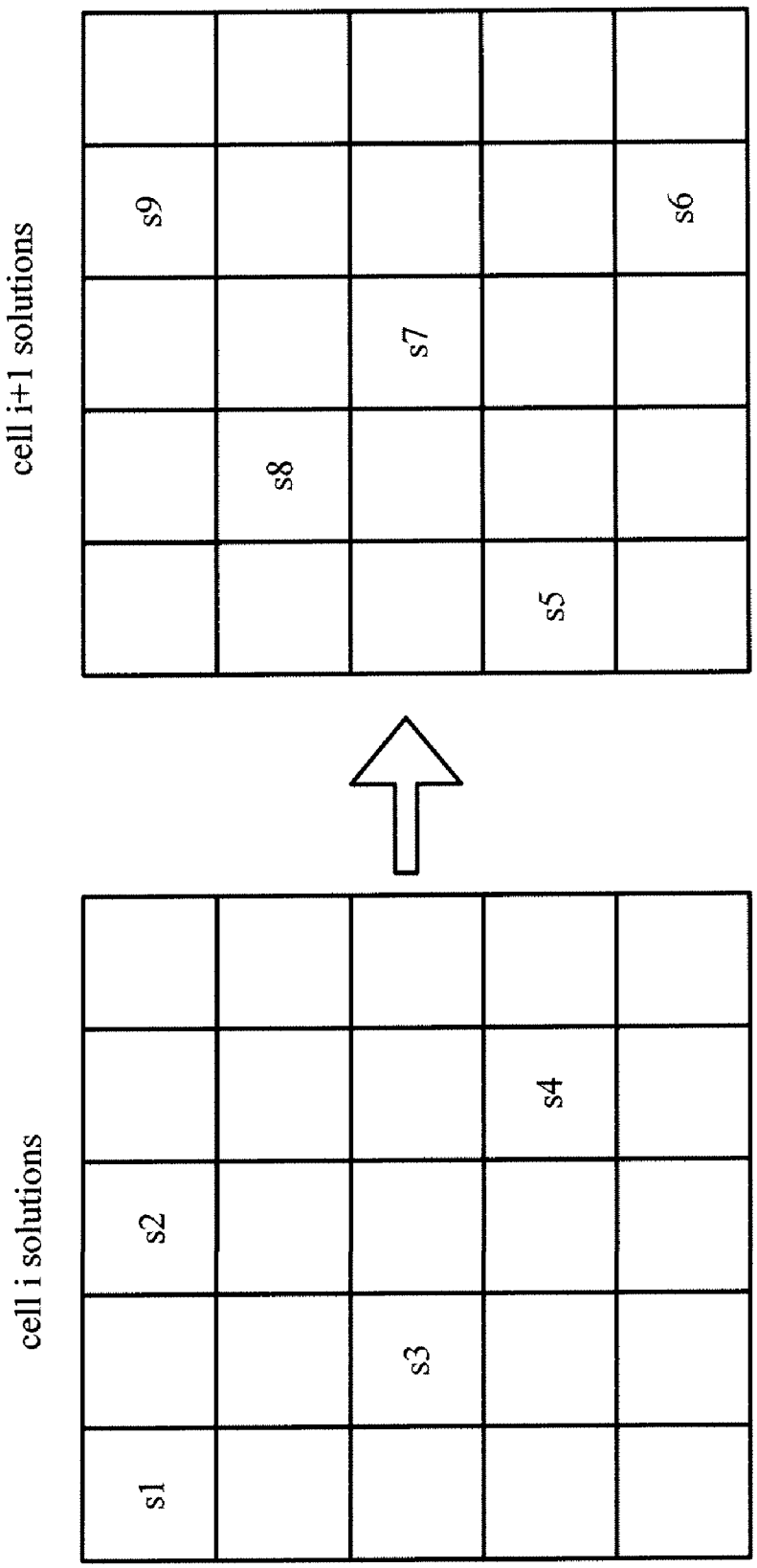
FIG. 13 shows an array of solution spaces.

In this process, the cells are removed from the rows and added back one at a time. Each time a cell is added that cell generates an array of solution spaces that is used to seed the next cell. However, each new cell requires a new solution space array to be allocated. After all of the previous solutions have been processed, they are all thrown away and replaced with the new solution array. An example is shown in FIG. 13. Note that solutions s1 through s4 include all of the cells from 0 to I. The solutions s5 through s9 were generated using s1 through s4 as a seed, although none of solutions s1 through s4 are valid in the right array since all solutions in the right array must include all cells from 0 to I+1.

Figure 14:
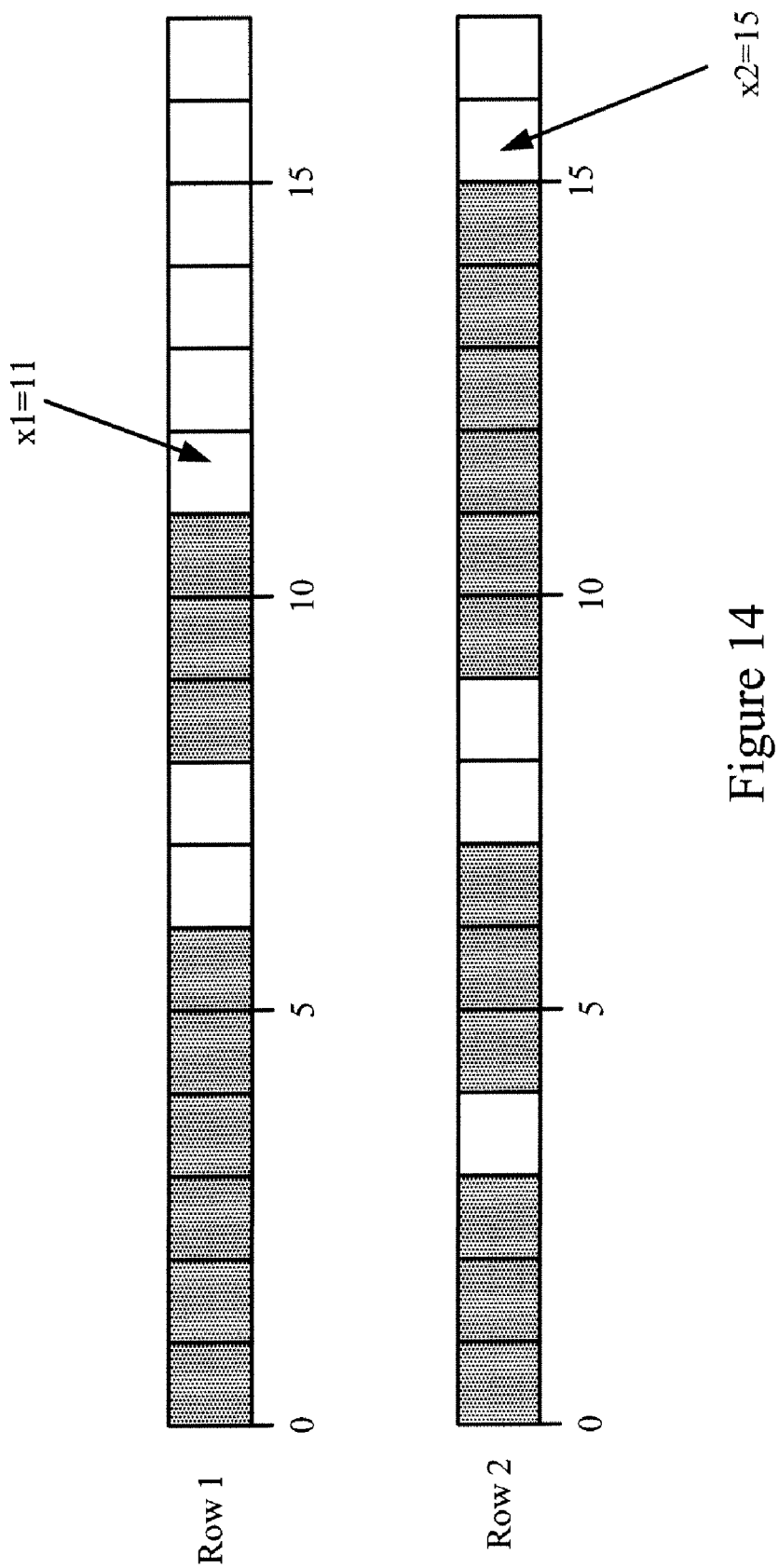
FIG. 14 shows an intermediate solution.

Considering the problem of pruning the search space, the first step is to transform the search space into a new coordinate system. Consider the intermediate solution shown in FIG. 14. With the indexing scheme described in the overview, the above solution would be stored at the location marked by x1=11, and x2=15 (the locations of the next available site in each row). However, another way of representing these coordinates would be using the offset between the two rows. As described above, the term "offset" is calculated by subtracting x2 from x1. The above example would then have an offset of minus four. Also mentioned above, a search space always includes cells with the same number of cells, so for a given search space array, how many sites are filled in is known. So, given the number of filled sites and the offset between the rows, the only other parameter left to give us the exact coordinates for x1/x1 would be the number of empty sites.

Consequently, in the above example, there are nine sites filled in row1 and 12 sites filled in row2 for a total of 21 sites. There are also 5 empty sites which leaves us with a total of 26 sites to the left of x1/x2. To calculate x1/x2, we use the following formula:

$$x1 = \frac{(\# sites + \# gaps + offset)}{2}$$

$$x2 = \frac{(\# sites + \# gaps - offset)}{2}$$

Plugging in the above numbers, this results in x1-(21+5+-4)/2=11, and x2=(21+5-4)/2=15.

This becomes easier to prune. First of all, one can assume that as cells are added to the rows, the offset between the rows will never get too large. This already prunes the search considerably. As far as the empty sites or gaps" go, one can restrict each solution space to consider only a narrow range of possible gaps, and modify this range moving from cell to cell.

Figure 15:
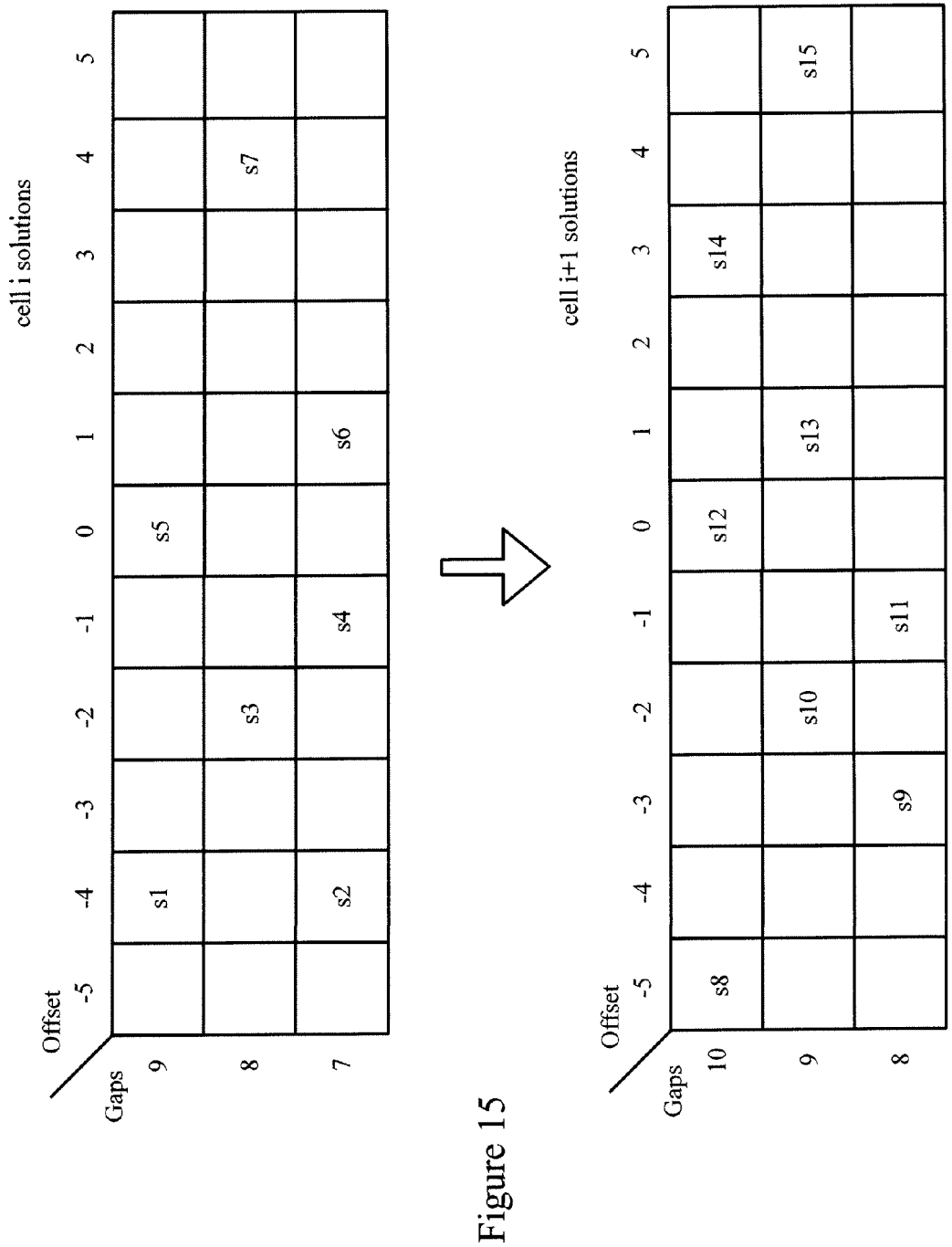
FIG. 15 shows a plurality of search spaces.

For an example of how the search spaces might look, consider the example shown in FIG. 15. For the solutions of cell I, only solutions that have 7, 8, or 9 empty sites to the left of x1/x2 are considered. As the cell I+1 is added, the gaps were incremented such that gap counts of 8,9, and 10 are now considered. Note that when generating new solutions starting from s2, s4, and s6, one must add at least one empty site in order to generate solutions that exist in the search space for cell I+1.

One thing to note is that the run-times increase with O(gaps$^2$) while only increasing with O(Offset). The runtime is linear in the size of the offset purely because the search space increases linearly. The search space also increases linearly with respect to the number of gaps being considered, but there is one additional factor that slows things down. The number of solutions generated from each starting solution is not affected by the size of the offset array . . . there will always be two solutions generated from each seed solution when the gap count is held constant. Either the cell will be placed in the top row where the offset will increase by "width", or it will be placed in the bottom row decreasing the offset by "width". However, when the gap count is increased, the number of solutions generated from each seed solution increases linearly in addition to the size of the search space increasing linearly. This is because a cell is placed in each row, one can try it for each of the gap counts that exist in the solution space.

Referring to the "s4" in the above example, it can be seen that it will generate six potential solutions in the solution space for cell i+1. Suppose the cell i+1 has a width of 1 site. A solution of (gaps=8, offset=−3), (gaps=8, offset=1), (gaps=9, offset=−4), (gaps=9, offset=+2), (gaps=10, offset=−5), (gaps=10, offset=3) is generated. Moving from cell to cell, it is necessary to adjust the gap count to ensure that the cells are being placed close to their attract location. The way that this new gap count is calculated is by setting the gap count to generate an x-location that is closest to the attract point of the cell when the offset is zero. Given a zero offset, the following equation results:

$$x1=x2=(\#sites+\#gaps)/2$$

Rearranging this equation gives;

gaps=2*attract_x−#sites

This calculation is performed each time a new cell is added. The one caveat is that one needs to make sure that the gap count is not increased too quickly or potential solutions may be eliminated. For example, when the swapping begins, the initial search space is seeded with a single solution at offset=0, gaps=0. Now suppose the first cell, of width 10, has an attract point of x=10. If one immediately sets the gap array to start at 10 to move the cell to its desired attract point, the two solutions being generated will have an offset of 20 and −20. If these fall outside the range being considered in the offset array, it will not be able to generate a legal solution and the entire process would fail. Another thing to note is that in the case of power straps and blockages, it is possible that there might not be a legal solution, even though a legal solution exists.

Figure 16:
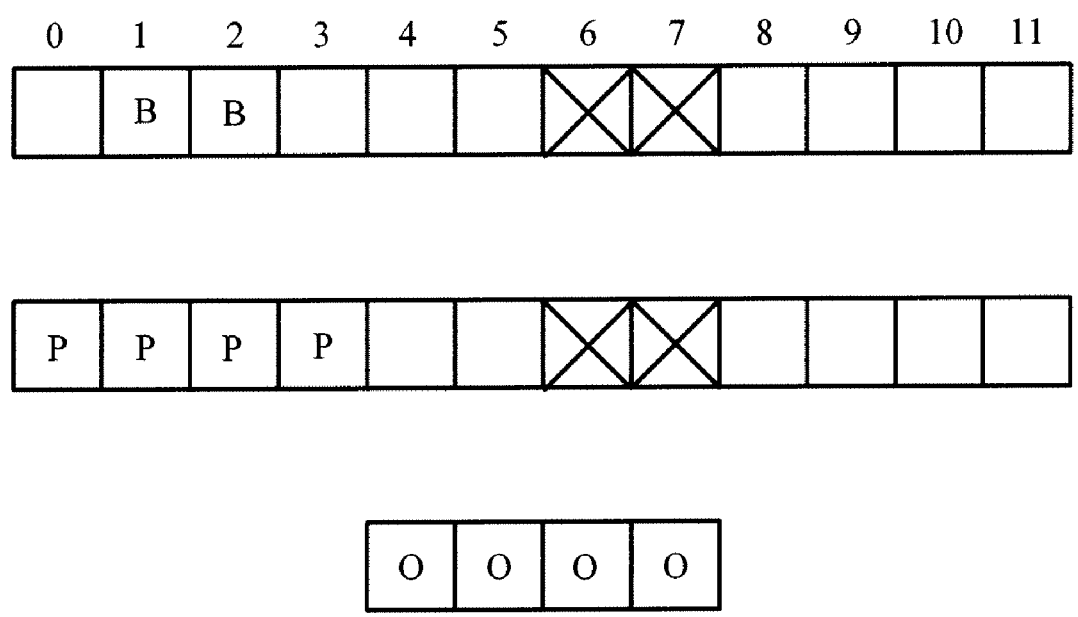
FIG. 16 shows a solution in the case of power straps and blockages.

Consider solution shown in FIG. 16. Note that the above starting solution has gaps=1. If the orange cell were to be added into the above solution, the only valid solutions would have a gap count of at least three. If the new solution space doesn't include this gap count, then it will be unable to generate a solution from this seed and it will be thrown away. The problem that these blockages (and also power straps) generate is that the way the dynamic programming search space is restricted means that the blockages will form a sort of "bottleneck" where only a few solutions make it to the other side, and not necessarily the best ones. This is especially true since the default mode that the detailed placer runs in has only one element in the gap-array, giving cells little freedom to adapt themselves to restrictions in the row.

To help ensure that the row swapping code never makes the solution worse that it started with, the cost of the rows, "optimally placed" is calculated before the row swapping. At the end of the row swapping, if this cost is worse, then the solution is rejected reverts to the original solution. In really strict cases, the row-swapping technique in low effort mode is unable to find a legal solution (even though a legal solution was started from). This is due to the fact that the search space restricts the solution to the point where all solutions disappear when passing through one of the bottlenecks described above. To work around this case in the context of power straps, the process will actually allow an illegal solution in certain circumstances. It only does this when no legal solution can be found for a cell starting from one particular solution. The cost for this illegal solution is heavily penalized to discourage illegal solutions from being chosen if a legal alternative is available. At the very end, the checkpointing described above will make sure that one never makes a legal solution illegal, or increase the cost over the starting solution. The blockages do, however, affect the offset. That being said, one needs to make sure that the size of the offset array is large enough to allow cells to swap past the blockage.

To better understand how the dynamic programming would break down in the case of cells that overlap blockages, consider the examples shown in FIG. 17. It can be seen that both of the above solutions have an offset of zero and five gaps placed. However, they have a different x1/x2 location. This would mean that two very different starting points would map to the same position in the solution space, and the assumption that all solutions that map to the same location provide identical starting points for subsequent solutions is violated. Another thing worth noting is that there is no reason why the gap counts in the gap/offset array need to increment by one. It might make more sense in some cases to generate a more intelligent set of offsets that allow a greater range of solutions to be considered. In the currently preferred embodiment, the process allows arbitrary gap elements in the gap/offset array. Currently, if the size of the gap array is 3, then one above and one below the "ideal" offset will be used.

Figure 18:
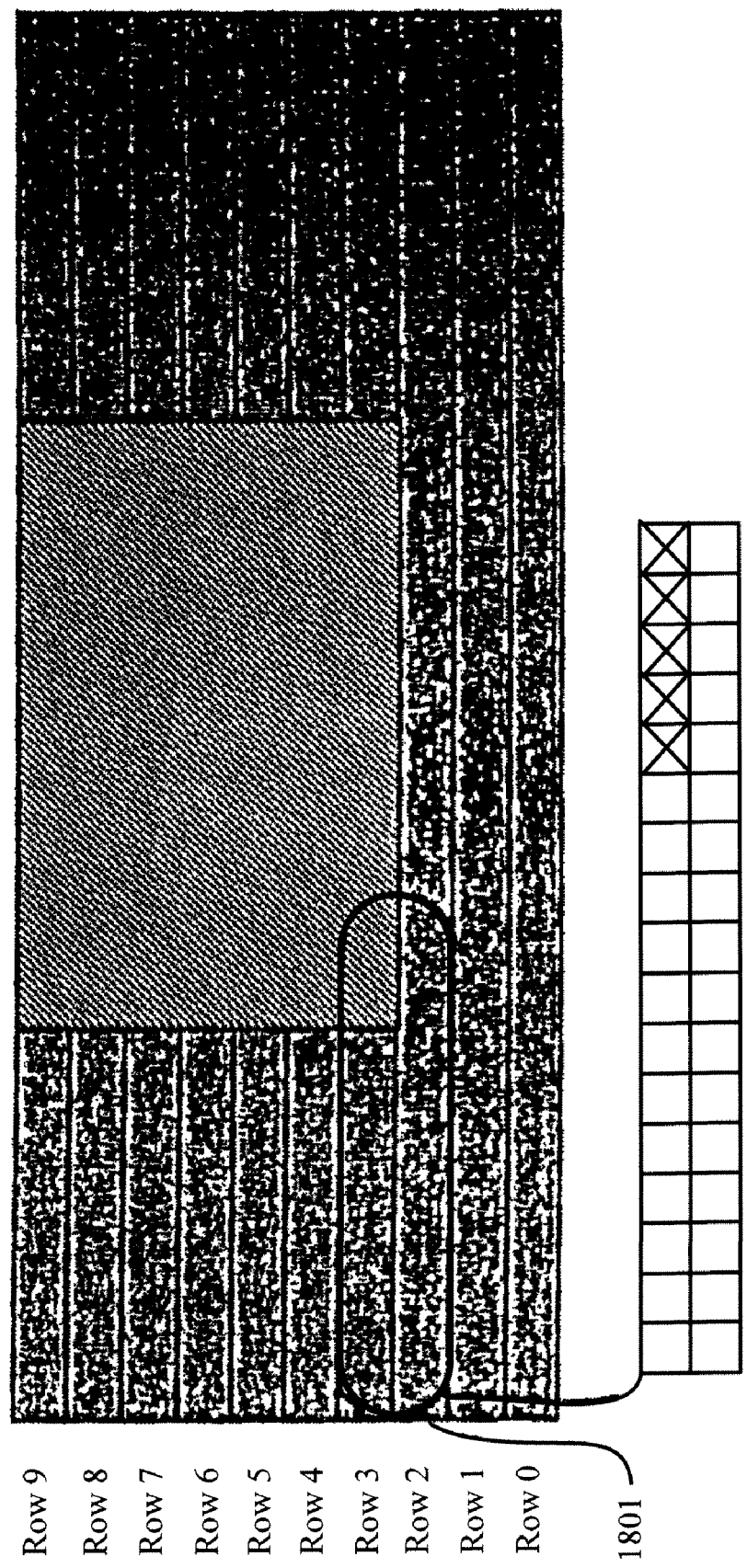
FIG. 18 shows an example of how row swapping can be accomplished with blockage.

Another complication in the row swapping process is the case where a blockage breaks a row up into smaller pieces. FIG. 18 shows an example of how row swapping can be accomplished with blockage. When swapping between the rows 2 and 3, the area 1801 is considered for swapping. However, it is not really necessary to consider swapping all of the cells in row 2, since the cells on the right side of the block will not want to be swapped into the left subrow of row 3. As a result, the rows are pruned down leaving a slight overlap with the blockage which leaves a zoomed in look at the two rows.

Since arbitrary blockages can cause incongruous combinations of rows, special case code is written to generate all possible pairs of subrows to consider for swapping. All pairs of subrows between two rows that overlap are considered swapping candidates, although the amount of the rows considered for swapping will be pruned based upon the amount of their overlap. Note that this pruning of the row sizes is not just a simple heuristic, but is actually essential to keep runtimes reasonable. If the entire row 2 is considered for swapping with the subrow to the left of the blockage in row 3, the search space considered for swapping between the rows would have to be expanded to allow very large offsets between the rows. This is because any legal solution will have a large offset since no cells can be placed in the left subrow of row 3 after the blockage starts.

In order to keep the memory usage and runtimes efficient, a novel scheme, is needed to be determined for storing these solutions. Rather than copy the information about a solution from one array to the next, a linked list of solutions is kept. As each cell is added, a structure is created containing information about that row, and a pointer is put to the solution that it was derived from. Reference counts are kept to indicate the number of pointers to a particular solution, and when this number reaches zero, the solutions are recursively garbage collected. The following is what the data structure looks like for one of the element of the linked list of a solution:

| dplc_full_swap_solution data structure | |
| --- | --- |
| dplc_full_swap_solution | parent |
| dplc_cell | cell |
| boolean | to_row1 |
| double | cost |
| int | ref_count |
| int | row1_xloc |
| int | row2_xloc |

As mentioned above, the parent pointer points to the solution that this solution was derived from. The cell pointer is a pointer to the current cell that was added by this solution (which could have been kept in a parallel array to remove the need to store this in each solution). The "to_row1" flag is used to indicate which row this cell was placed in. The "cost" field is the current cost of the solution. The "ref_count" field keeps track of the number of solutions that are derived from this solution. It should be noted that the last two fields are not strictly necessary. They contain the next available site (x1/x2) for each of the two rows. Since the position in the array of the solution determines information about the offset and gap counts, these fields can be calculated. In the absence of internal (non-opaque) blockages, this calculation is extremely easy and the formula is described above. However, internal blockages are not counted as gaps, and are effectively treated like they do not exist at all in all of the calculations. This makes the search space more efficient since empty sites don't have to be placed to move a cell beyond a blockage. However, this makes the formulas for calculating the current x1/x2 locations much more complicated.

Greedy clean ups is now described in detail. After the row optimizations have been done, a final greedy phase is performed to try and clean up after the dynamic programming row swapping. This approach sorts the cells in order of their displacement from their attract points, puts the cells into a queue, and then starts popping off the cells one at a time and tries swapping their rows. This swapping is done by moving the cell from their current row and figuring out the reduction in the cost of that row after the cell is removed. The cell is then added to the row that it snaps to based upon y-attract to see if a better solution is obtained. If the cost is worse than the original, the cell is then tried both above and below the attract row. This continues until the y-distance displacement of the cell alone is greater than the cost reduction of removing the cell from the original row. For example, if the cost reduction is equivalent to 2-row heights, it would not make sense to place the cell 3-row heights away from its attract point as it would be guaranteed to be a worse solution.

There is also a user threshold passed into the routine that tells the greedy swapper to not look further than N rows from its attract point. This is to avoid run-time problems when the input to the detailed placer is poorly placed. There have been times that the input to the detailed placer consisted of a blob of cells in the center of the block. After the cells were spread out into legal locations, an average cell was 20 rows from its attract point. The area around its attract point was filled to 100% density, so without a termination threshold, the greedy approach would try 40 different rows before deciding that the cell was best where it started.

The other reason for adding this threshold is to allow the greedy swapper to be run as a quick first pass to the initial placement. The ideal input to the dynamic programming row swapper is one where the cells are very close to their y-attract row. If the greedy swapper was allowed to move cells as far as it wanted while minimizing the cost, it is very possible that it could make the overall circuit better while making the final circuit worse by moving cells a long ways away from their y-attract points to find a better x-location. Depending on the make-up of the input circuit, the two different row-placers are used to calculate the costs. Ideally, the center-of-gravity row placer would be used since its incremental behavior would allow a large number of swaps to be attempted with little runtime. This approach will not work with non-opaque blockages or power straps, although the latter can be taken care of by turning the non-opaque blockages into opaque blockages to break the row into two separate rows. The case of power straps will unfortunately prevent this row placer from being used.

One thing to note is that this greedy swapper provides a good complement to the dynamic programming row placer. This is because their success rates vary in opposite directions with respect to the density. In the case of 100% density, the dynamic programming row-swapper search space becomes one-dimensional (since the gap count is always zero). Because of this, if the offset is sufficiently large, it will be able to come up with an optimal solution. However, in the case of lower densities, the pruning of the search space impacts the results more seriously, and while the global solution is still a good one, cells are often left sitting in the wrong row, even though the sites at its desired attract point are sitting vacant.

Figure 19:
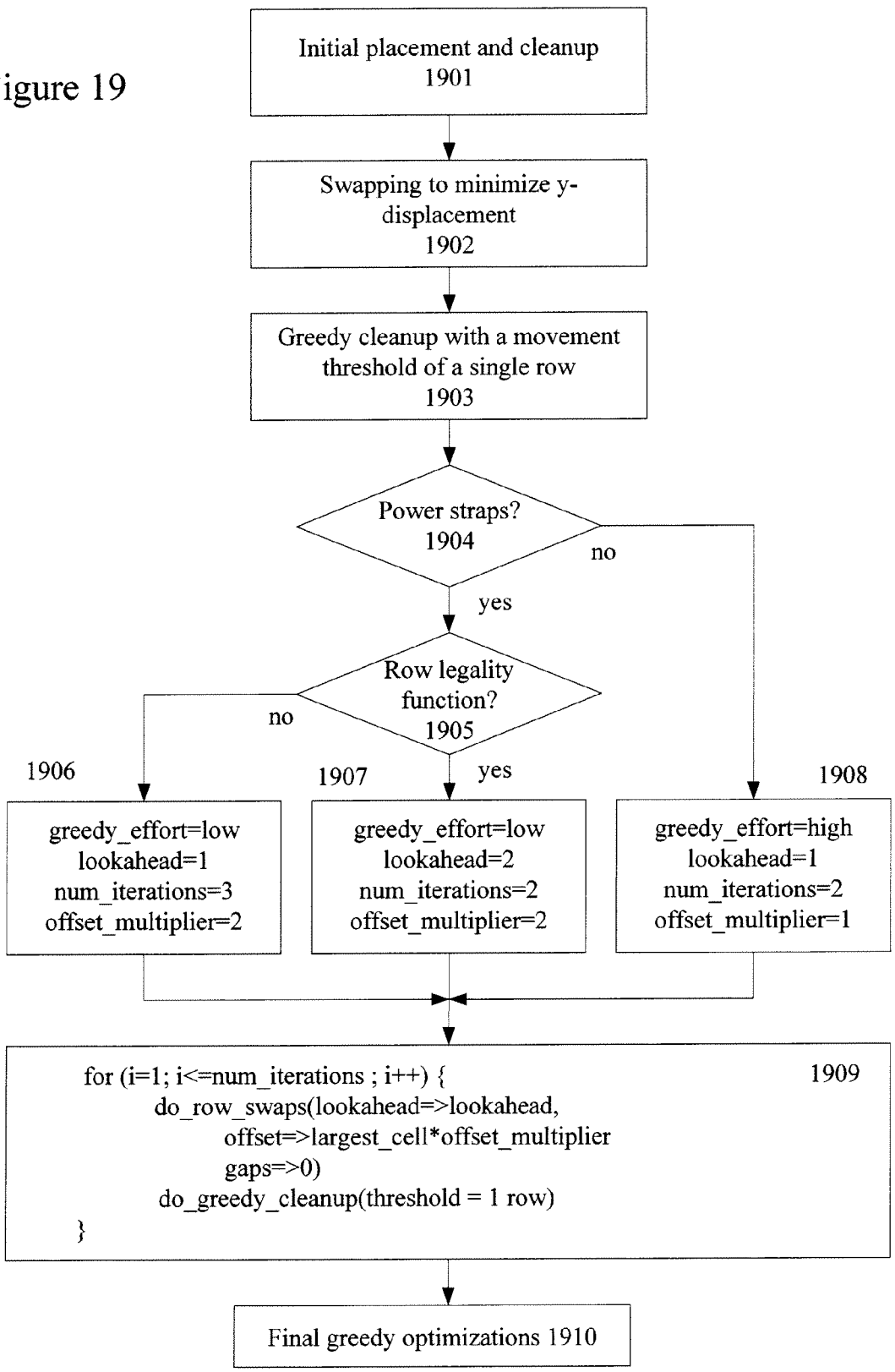
FIG. 19 shows the flow for the low effort mode in the absence of multi-row cells.

In the case of blocks that have been run through congestion driven coarse placement, it is very likely that the block will contain densities near 100% in the non-congested portions of the block, while containing densities of even less than 50% in the areas with higher congestion. The combination of the dynamic programming row swapping and the greedy cleanups provides a powerful one-two punch in these situations. The correct order in which the processes are applied, and which parameters are supplied are critical to the performance of the placer. It has been discovered that modifications to the flow can be made to adapt to different circuit styles. In the currently preferred embodiment of the present invention, the flow for the low effort mode in the absence of multi-row cells is shown in FIG. 19.

To understand the terminology, the presence of a "row_legality_func" implies that some cells may not be legal in an entire row. To avoid a cell getting trapped under a row that it can't move above, the row swapping is done with a lookahead that allows a cell to jump past a row.

The parameters to the row swapping routine are:

Lookahead: The number of rows that are checked in the direction of the row swapping. The runtime of the swapping is linear in this factor since the number of row swaps that is performed is approximately equal to lookahead multiplied by #rows.

Offset: The size of the search space in the "offset" direction. Note that this indicated that offsets of +/− this number are legal, so the size of the array is really 2*offset+1.

Gaps: The "offset" from the center or "ideal" gap number that is considered. If the formula described above determines a desired gap count of 10, then solutions with 10+/− gaps will be considered. Consequently, the size of the array is 2*gaps+1.

The flag "greedy_effort" is used to determine how many cells are considered for swapping. In the case where the incremental center-of-gravity row placer cannot be used high effort is used instead, which allows all of the cells to be rapidly swapped. In the case where the non-incremental row pacer needs to be used only the worst 2-3% of the cells are tried.

In the case of effort levels greater than one, the "do_row_swaps" is iterated. The various search space parameters (lookahead, offset, and gaps) are progressively increased to allow for more and more precision in the swapping. A formula tries to guess the run-time complexity of each of these parameters, and uses it to calculate how many times slower than the single effort mode this approach is. This number is subtracted from the effort level flag that is passed in, and the process keeps iterating until the effort flag reaches zero. This effectively gives a runtime that is roughly linear in the effort parameter that is passed in.

Another heuristic that was added was one to help with the case where there are illegal rows. Especially with high densities and power straps, it is quite possible that at the start of the row swapping there will be a number of illegal rows (not filled to over-capacity, but restricted such that 100% utilization of the sites in the row is not achievable). To help ensure that the detailed placer comes up with a legal placement, whenever the row swapping optimizes a row and still finds it illegal after the optimizations, extra effort is placed on this row. First, the exact same row swapping is attempted with a larger search space. The "gaps" parameter is increased by 3 (which in the low effort mode means increasing the number of rows in the gap dimension from 1 to 7), and the "offset" parameter is doubled.

If the rows are still illegal after this higher effort swap, then swapping is attempted with the next row. This lookahead will basically keep on swapping with the next row until a threshold of 3 rows beyond the normal lookahead is reached. At this point, if the row is still illegal, it stops. One thing to note is that there is a boolean flag passed in to the "is_legal" query function that specifies whether or not cells are allowed to be swapped from their x-attract sorted order (in the primitive way described above in the row placement algorithm). When this part of the code is checking for legality, it sets this flag to be false, meaning that the row must be legal without allowing the swapping of cells. When working with high density designs with lots of restrictions, there are often a large number of illegal rows before the first row swapping phase, only a few after the second, and then none after the third. In the case, a check that runs a couple more low-effort iterations of the row swapping if the placement is still illegal may be run. This could be achieved by the user currently by setting the legalization effort switch to something higher than "low".

The method for handling multi-row cells is now described. Cells with a height of greater than one provide an added complexity. Their placement has an impact not only on the other cells placed in its row, but in one or more rows above as well. This means that many of the above approaches break down. The row-swapper can no longer perform row swaps with these cells, and the single-row placer can no longer find optimal placements for a row since it unable to measure the impact of moving a multi-row cell on other rows. However, given that there are not too many multi-row cells in a row, a current set of heuristics used inside of the detailed placer are used to place these cells. The first step is that the multi-row cells get snapped to their nearest legal location. This is done by taking the multi-row cells and placing them into the row that they snap to. The single-row placement algorithm is then used to optimize their initial location. This location is then used to snap the cell down, at which point it is treated as a non-opaque blockage, and the corresponding blockage vector and available sites for the rows that the cell occupies are updated. After all of the cell have been snapped down, the normal flow proceeds in the same fashion as if the multi row cells were abstract blockages passed into the detailed placer.

The only other difference is that every time the dynamic programming row-swapping code is invoked, the multi row cells are "un-snapped", and the row-swapping code is invoked to re-place the cells within the row in the context of the other cells around them in two separate passes. The first pass operates bottom up. It unlocks each of the N-high cells and then places the cell in the row. The rows are processed starting from the bottom, and then as the cell's location is optimized, the cell is then locked down and again treated as an opaque blockage. The bottom up processing ensures that the impact of the cell on other rows will be seen (even if it is not optimized). The second pass is identical to the above one, except that the pass is performed top down. To ensure that the effects of cells and their blockages are properly observed, when the multi row cells are placed into rows, they are inserted in the top row of the rows that they straddle (i.e. "Y+cell_height−1"). Thereby, their impact on the following rows will be properly observed. This approach of moving the cells within a row currently completely ignores all rows except for the one that the multi-row cell is being placed in. Because of this, it is possible that illegal rows will be created in the other rows the cell straddles. To ensure that the solution is not worsened, the costs are cached before and after the swaps, and only the swaps that improve the cost function is kept.

FIG. 19 shows the flow for the low effort mode in the absence of multi-row cells. First, the initial placement and cleanup process must be performed in step 1901. Next, swapping is performed to minimize y_displacement, step 1902. A greedy clean-up with a movement threshold of a single row is then performed in step 1903. In step 1904, power straps are determined. In step 1905, a row legality function is invoked. The flow progresses to either block 1906, 1907, or 1908, depending on the decisions springing from decision steps 1904 and 1905. Blocks 1906-1908 set the greedy_effort, lookahead, num_iterations, and offset_multiplier variables. Thereupon, the pseudocode depicted in step 1909 is executed. A final greedy optimization is then performed in step 1910.

Figure 20:
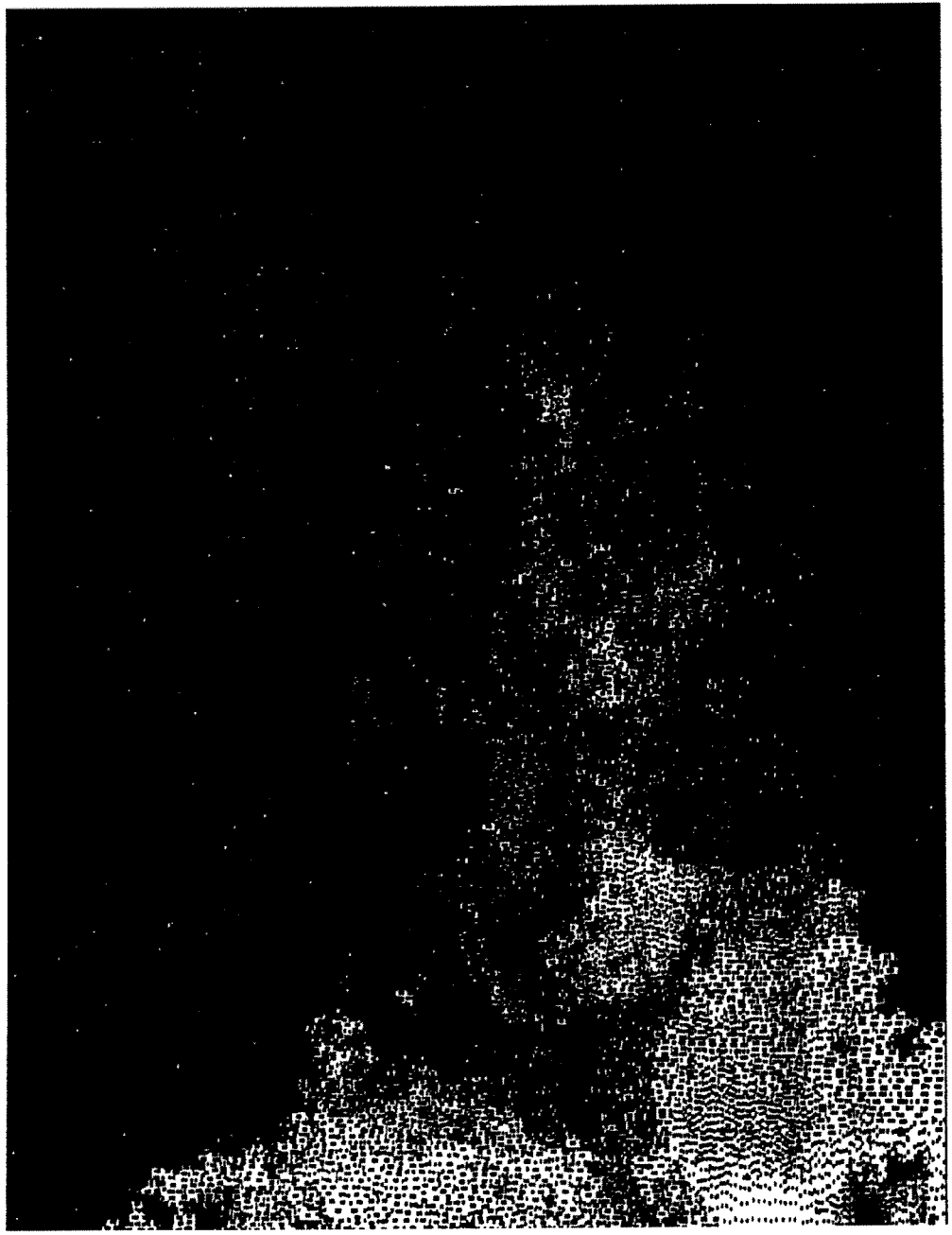
FIG. 20 shows an exemplary layout of a circuit before detailed placement.

FIG. 20 shows an exemplary layout of a circuit before detailed placement. Note that some areas have a high degree of density (e.g., upper left corner), whereas other areas have a lower degree of density (e.g., bottom right). The dynamic programming technique described above works well at optimizing cell placement when dealing with high density situations, and the greedy cleanup phase with the incremental row placer expeditiously optimizes the low density situations. Thereby, the detailed placer of the present invention handles congestion driven placements characterized by non-uniform densities very quickly and efficiently.

Figure 21:
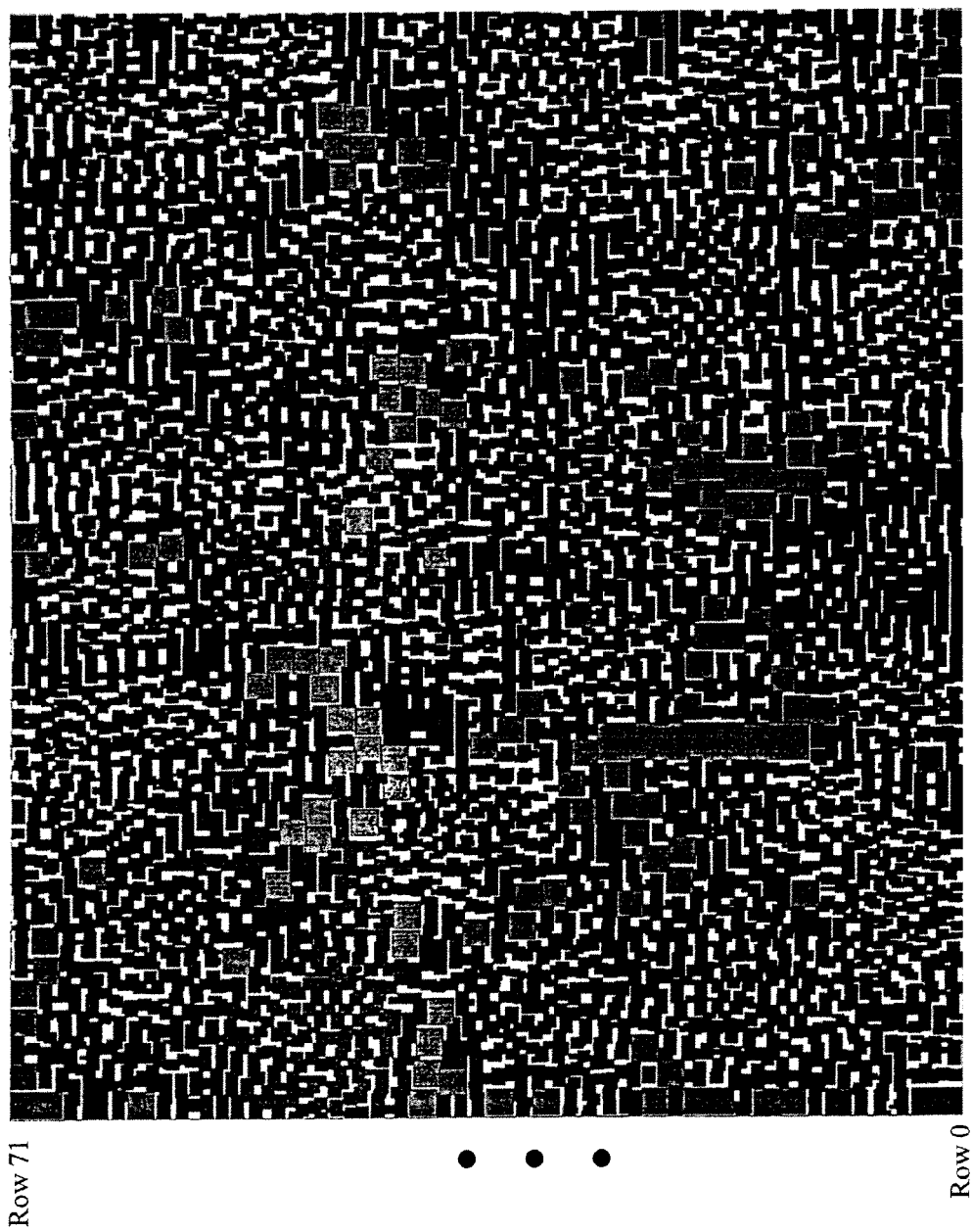
FIG. 21 shows an exemplary layout of a circuit before detailed placement has been performed.
Figure 22:
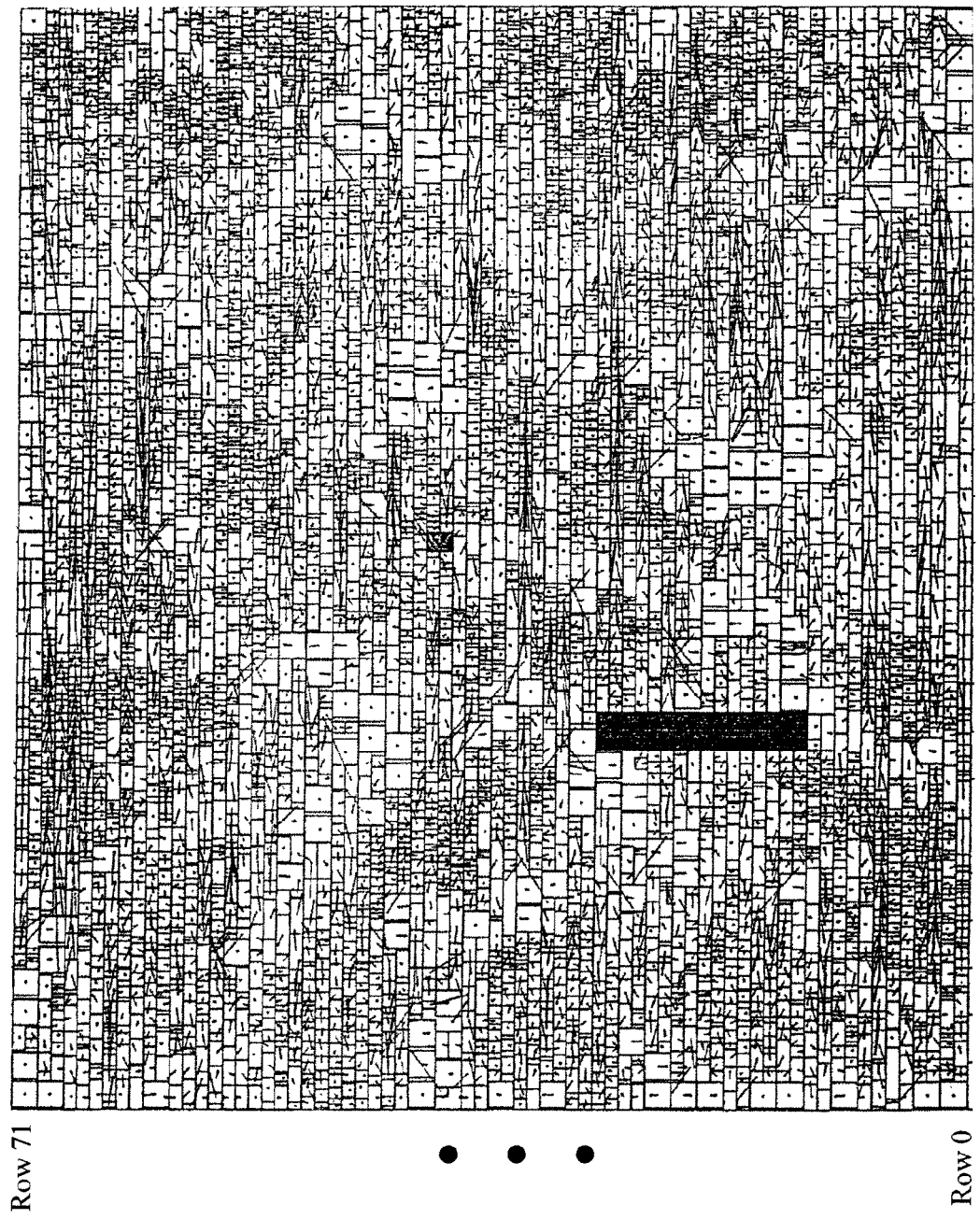
FIG. 22 shows the layout for this same circuit, but after legalization has been performed.
Figure 23:
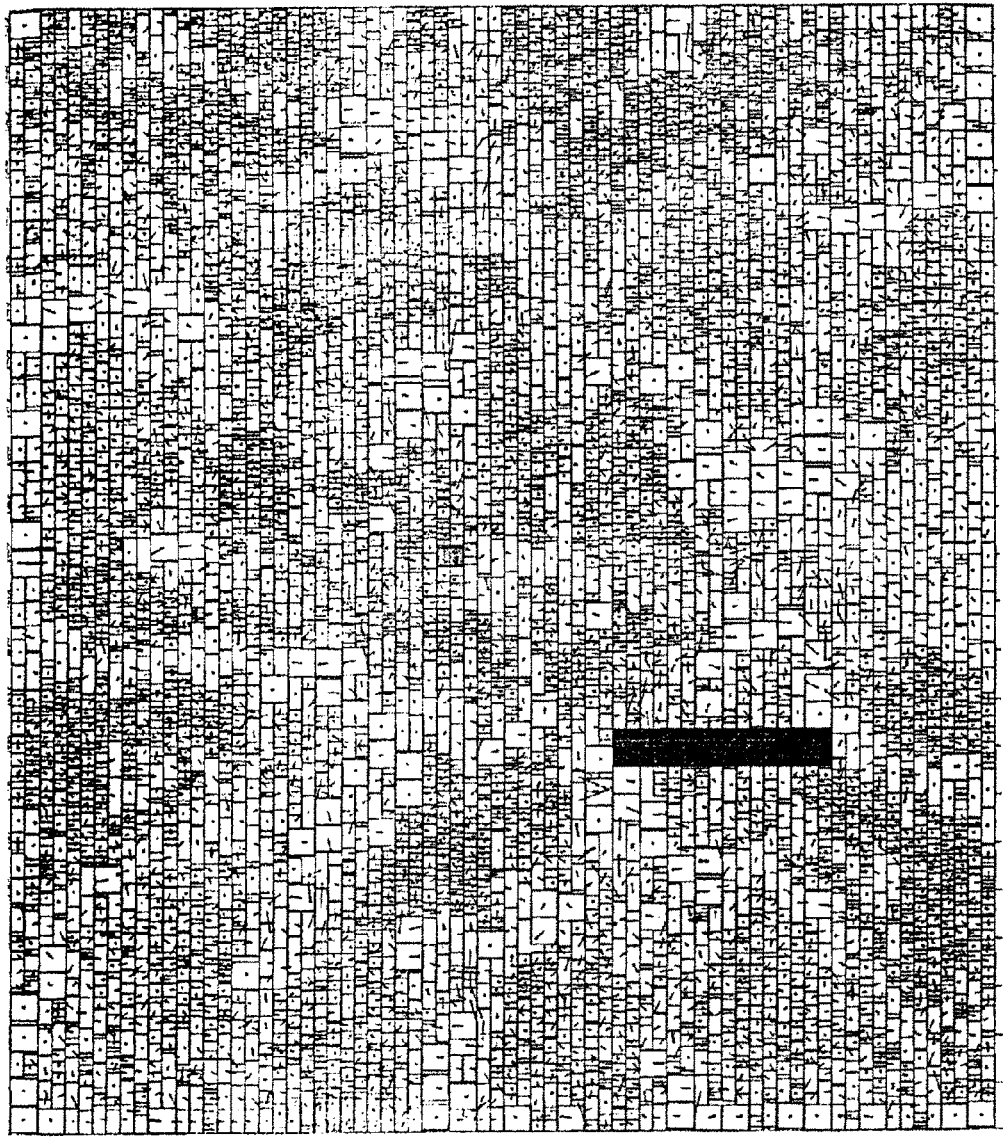
FIG. 23 shows the layout of the same circuit after the placements of the cells has been optimized.
Figure 24:
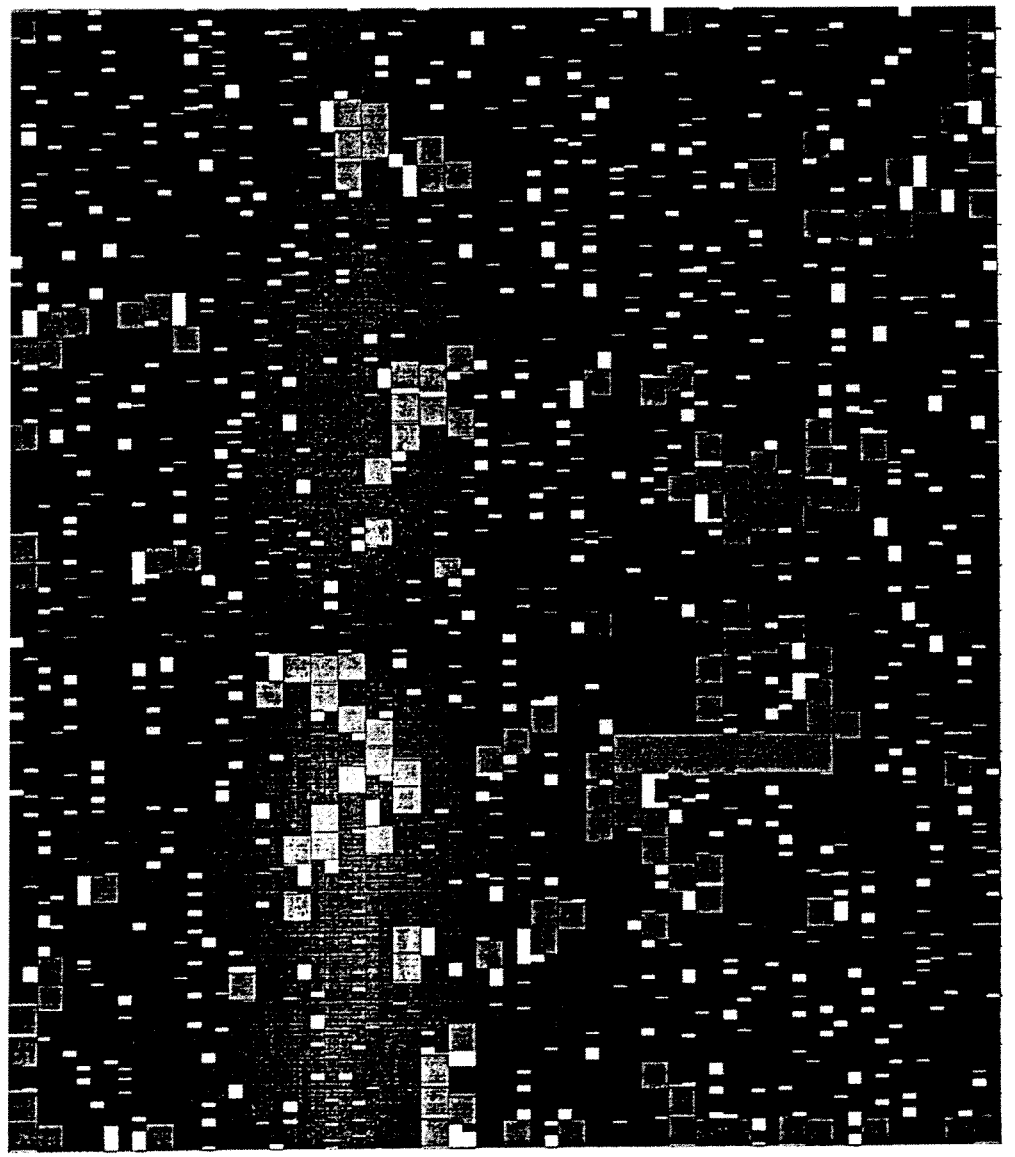
FIG. 24 shows the final layout of the circuit after the detailed placement process has completed.

To demonstrate the impact of the detailed placer of the present invention, FIG. 21 shows an exemplary layout of a circuit before detailed placement has been performed. FIG. 22 shows the layout for this same circuit, but after legalization has been performed. The short, dark lines and dots indicate the displacement vector which denotes how far a particular cell has been moved. The dot represents its starting location, and the magnitude and direction of movement is given by the short lines. FIG. 23 shows the layout of the same circuit after the placements of the cells has been optimized. Again, displacement vector show how the cells have been moved to optimize placement. And FIG. 24 shows the final layout of the circuit after the detailed placement process has completed. By comparing FIG. 24 to FIG. 21, it can be seen that overlapping cells have been removed and that there is less unused silicon area.

Figure 25:
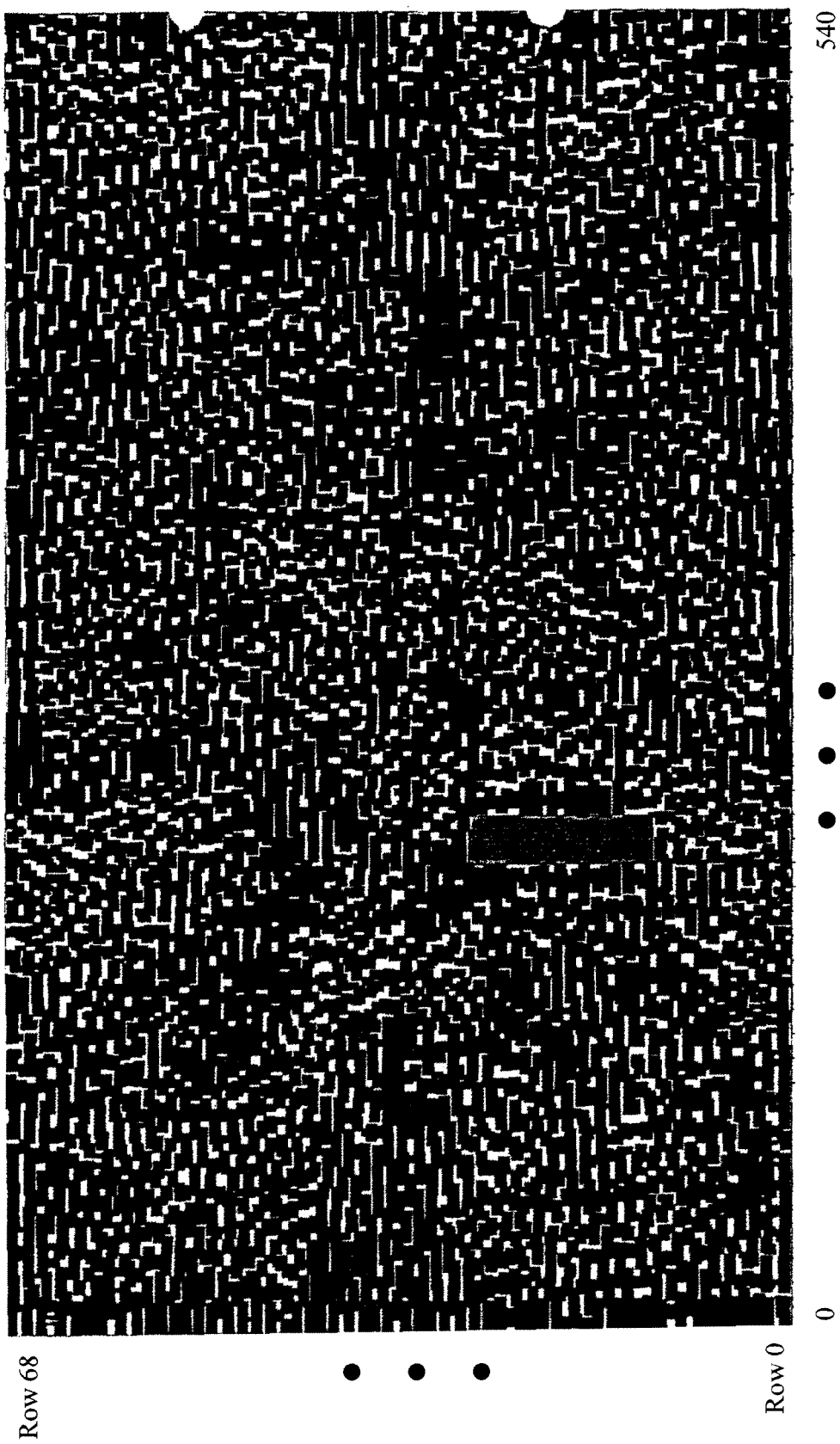
FIG. 25 shows an exemplary layout of a circuit before detailed placement is performed.
Figure 26:
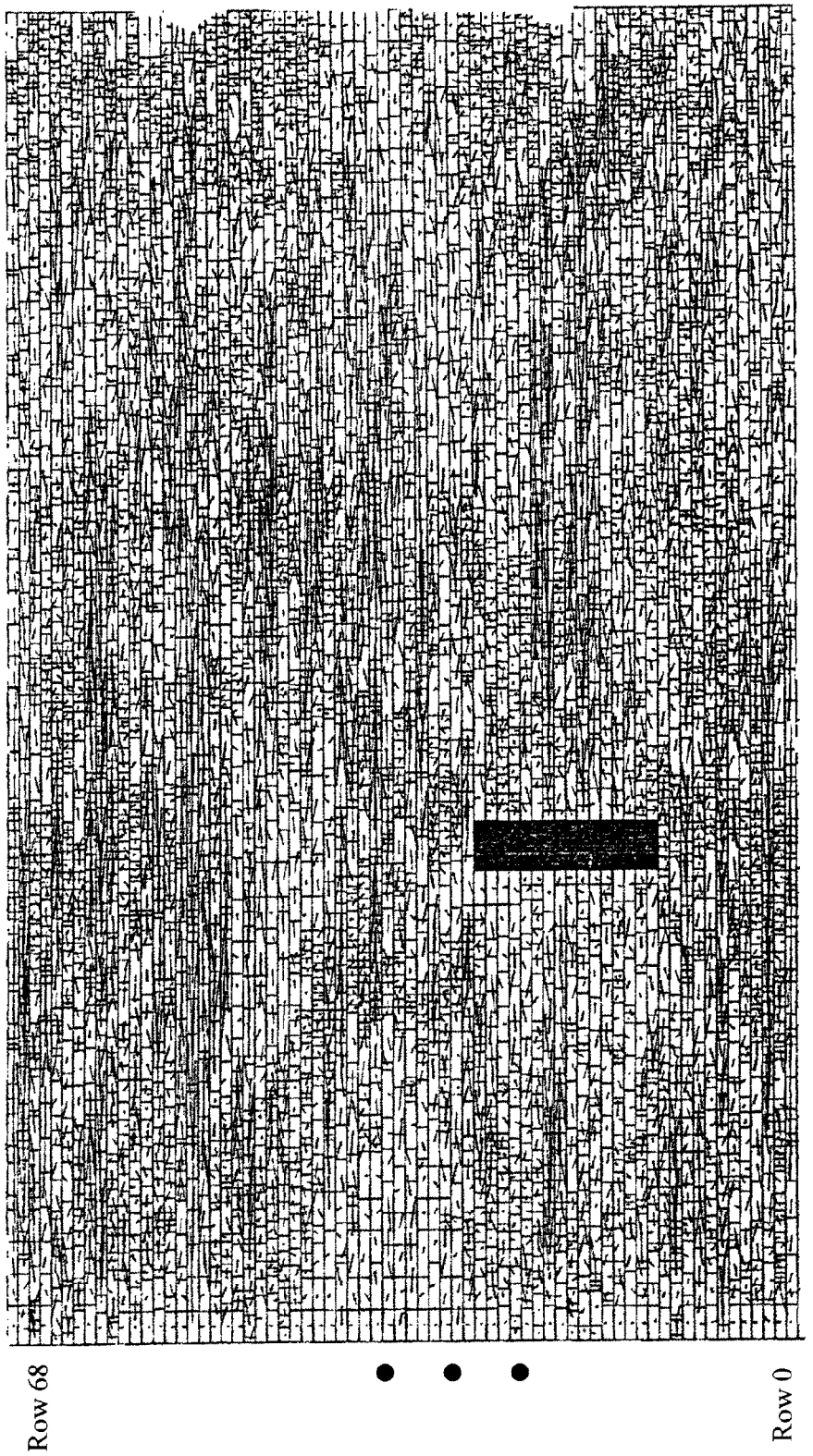
FIG. 26 shows the same circuit after legalization has been performed.
Figure 27:
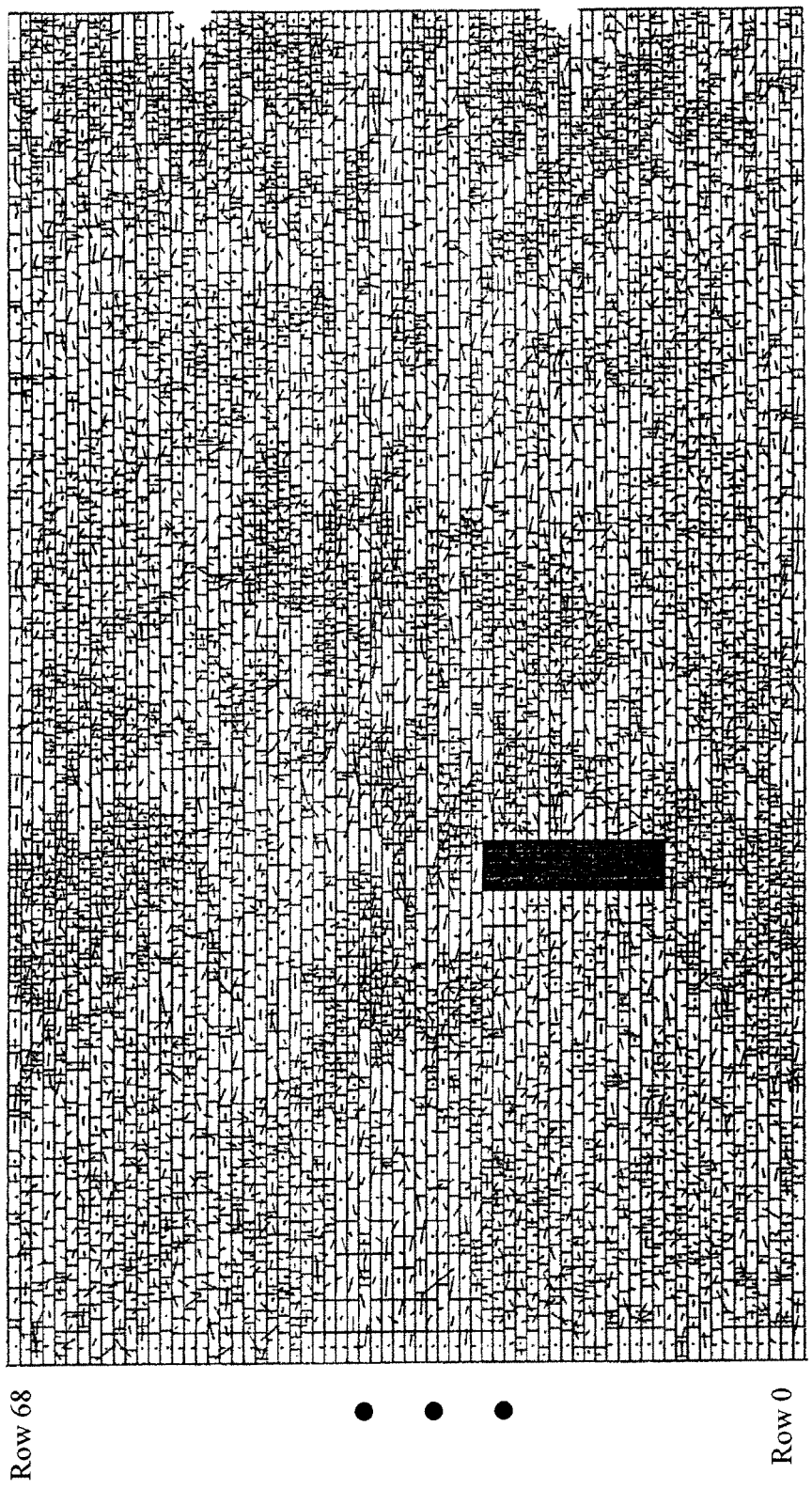
FIG. 27 shows the placement of the optimized cells.
Figure 28:
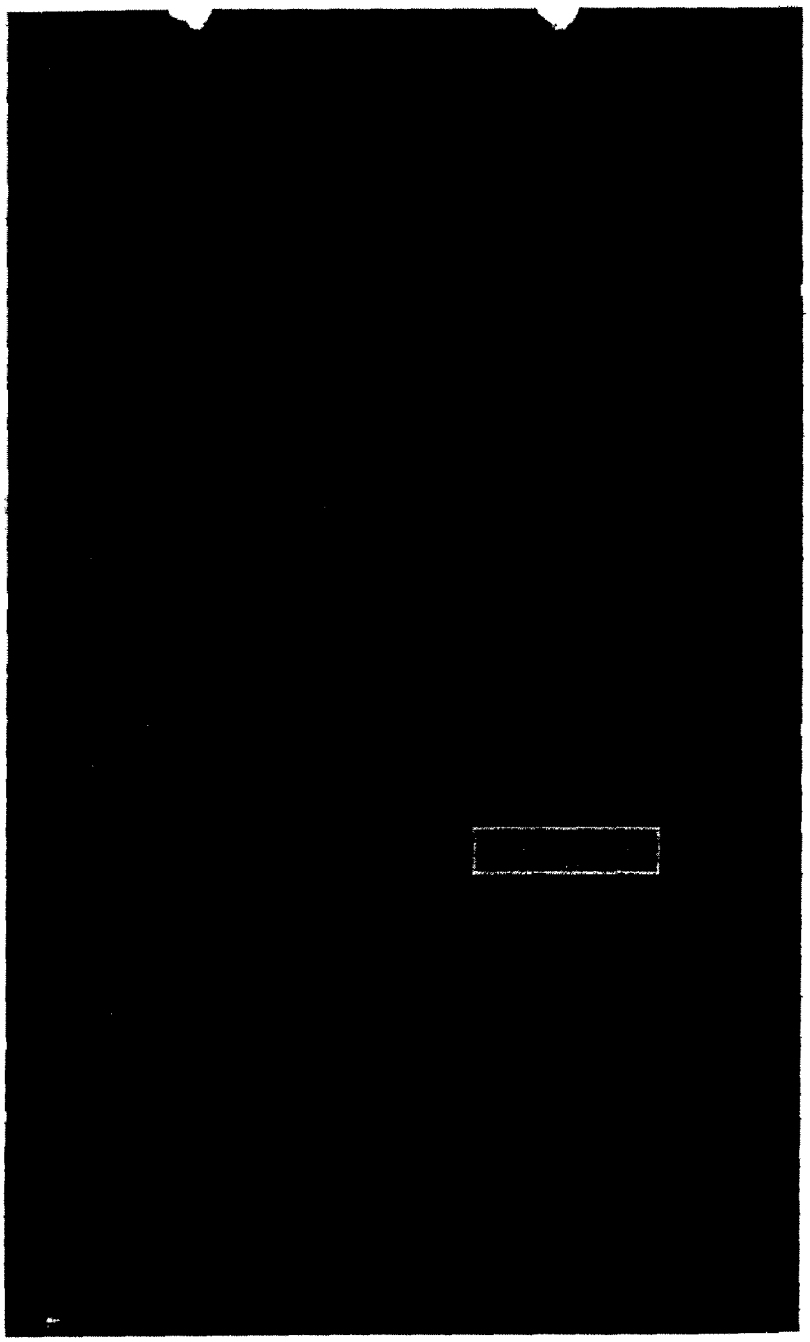
FIG. 28 shows the final layout.

Another example is now offered to show the placement process with one hundred percent density placement. FIG. 25 shows an exemplary layout of a circuit before detailed placement is performed. Note the clear areas between cells. Also, note that many cells are overlapping and thereby, illegal. FIG. 26 shows the same circuit after legalization has been performed. Again, displacement vectors are shown to depict how the cells have been moved. Note that there are now no longer any white, unused spaces. Also, there are no illegal overlapping cells. The placement of these cells are then optimized, as shown in FIG. 27. The final layout is shown in FIG. 28. It should be pointed out that in this example, a number of cells have already been defined. The sizes and shapes of these cells are predefined in a library. Consequently, the total area consumed by the cells can be calculated. The detailed placement process of the present invention determines how the cells are to be optimally placed to achieve one hundred percent density and all done in a linear run time (e.g., order N run time).

Thus, a detailed placer for optimizing high density cell placement with a linear run time is disclosed. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

The invention claimed is:

1. A method for placing cells of a netlist, the method comprising:
   performing a coarse placement process that assigns initial locations on a semiconductor chip to the cells;
   using a computer, performing a detailed placement process that assigns a final location to each of the cells by optimizing a cost function dependent on cell sites in pairs of rows; and
   using a dynamic programming process to perform a swapping of cells between the pairs of rows based on the cost function.

2. The method of claim 1, wherein the detailed placement process runs in linear time.

3. The method of claim 1, wherein a look-ahead parameter is used to control usages of the swapping of cells between pairs of rows.

4. The method of claim 1, wherein the detailed placement process further comprises pruning a search space during the dynamic programming process.

5. The method of claim 4, wherein the pruning is controlled as a function of a gap count.

6. The method of claim 1, wherein the detailed placement process uses a subroutine that finds an optimal legal cell location assignment for a single row in an absence of blockages.

7. The method of claim 1, wherein the detailed placement process further comprises assigning an initial cell location based on a result of the coarse placement process.

8. The method of claim 7, wherein the coarse placement process uses a conjugate gradient method.

9. The method of claim 7, wherein the detailed placement process further comprises the step of optimizing a y-location of the cells during initial cell location assignment.

10. The method of claim 9, wherein optimizing the y-location of the cells is also performed during the dynamic programming process.

11. The method of claim 10, wherein the detailed placement process further comprises performing a greedy cleanup phase.

12. A method of placing cells of a netlist, the method comprising:
    performing a coarse placement process that assigns initial locations on a semiconductor chip to the cells according to a conjugate gradient process; and
    using a computer, performing a detailed placement process that assigns a final location to each of the cells by optimizing a cost function dependent on cell sites in pairs of rows,
    wherein each cell location is aligned with a valid site boundary, no two cells are overlapping, and each cell is assigned to a group of legal sites.

13. The method of claim 12, wherein the detailed placement process runs in linear time.

14. The method of claim 12, wherein a look-ahead parameter is used to control usages of swapping of cells between the pairs of rows.

15. The method of claim 12, wherein the detailed placement process further comprises pruning a search space during a dynamic programming process for swapping of cells between the pairs of rows based on the cost function.

16. The method of claim 15, wherein the pruning is controlled as a function of a gap count.

17. The method of claim 12, wherein the detailed placement process uses a subroutine that finds an optimal legal cell location assignment for a single row in an absence of blockages.

18. The method of claim 17, wherein the detailed placement process further comprises assigning an initial cell location based on a result of the coarse placement process.

19. The method of claim 18, wherein the detailed placement process further comprises optimizing a y-location of the cells during initial cell location assignment.

20. The method of claim 19, wherein optimizing the y-location of the cells during initial cell location assignment is also performed during a dynamic programming technique.

21. The method of claim 20, wherein the detailed placement process further comprises performing a greedy cleanup process.

22. A method of placing cells of a netlist, the method comprising:
    performing a coarse placement process that assigns initial locations on a semiconductor chip to the cells;
    using a computer, performing a detailed placement process that assigns a final location to each of the cells by optimizing a cost function dependent on cell sites in pairs of rows,
    wherein each cell location is aligned with a valid site boundary, no two cells are overlapping, and each cell is assigned to a group of legal sites; and
    using a subroutine that legalizes a single row optimally according to a sum of squares objective in one of linear, quadratic, and polynomial run time.

23. A method for placing cells of a netlist, comprising the steps of:
    performing a coarse placement process that assigns initial locations on a semiconductor chip to the cells;
    using a computer, performing a detailed placement process that assigns a final location to each of the cells by optimizing a cost function dependent on cell sites in pairs of rows,
    wherein each cell location is aligned with a valid site boundary, no two cells are overlapping, and each cell is assigned to a group of legal sites; and
    using a subroutine that legalizes a single row optimally for a given fixed cell ordering in one of linear, quadratic, and polynomial run time.

24. A method of placing cells of a netlist, the method comprising:
    performing a coarse placement process that assigns initial locations on a semiconductor chip to the cells;
    using a computer, performing a detailed placement process that assigns a final location to each of the cells by optimizing a cost function dependent on cell sites in pairs of rows, wherein each cell location is aligned with a valid site boundary, no two cells are overlapping, and each cell is assigned to a group of legal sites; and
    legalizing a single row optimally using a dynamic programming technique for swapping of cells between the pairs of rows based on the cost function.

25. A method for placing cells of a netlist, the method comprising:
    performing a coarse placement process that assigns initial locations on a semiconductor chip to the cells;
    using a computer, performing a detailed placement process that assigns a final location to each of the cells by optimizing a cost function dependent on cell sites in pairs of rows, wherein each cell location is aligned with a valid site boundary, no two cells are overlapping, and each cell is assigned to a group of legal sites; and using a subroutine that legalizes two rows optimally according to a sum of squares objective in one of quadratic and polynomial run time.

26. A method of placing cells of a netlist, the method comprising:

performing a coarse placement process that assigns initial locations on a semiconductor chip to the cells;

using a computer, performing a detailed placement process that assigns a final location to each of the cells by optimizing a cost function dependent on the sites in pairs of rows, wherein each cell location is aligned with a valid site boundary, no two cells are overlapping, and each cell is assigned to a group of legal sites; and using a subroutine that legalizes two rows optimally for a given fixed cell ordering in one of quadratic and polynomial run time.

27. A method of placing cells of a netlist, the method comprising:

performing a coarse placement process that assigns initial locations on a semiconductor chip to the cells;

using a computer, performing a detailed placement process that assigns a final location to each of the cells by optimizing a cost function dependent on cell sites in pairs of rows, wherein each cell location is aligned with a valid site boundary, no two cells are overlapping, and each cell is assigned to a group of legal sites; and legalizing two rows optimally using a dynamic programming technique for swapping of cells between the pairs of rows based on the cost function.

28. A method for placing cells of a netlist, the method comprising:

performing a coarse placement process that assigns initial locations on a semiconductor chip to the cells;

using a computer, performing a detailed placement process that assigns a final location to each of the cells by optimizing a cost function dependent on the sites in pairs of rows, wherein each cell location is aligned with a valid site boundary, no two cells are overlapping, and each cell is assigned to a group of legal sites; and using a subroutine that legalizes a pair of rows optimally according to a y-displacement metric in one of quadratic and polynomial time.

29. A method for placing cells of a netlist, the method comprising:

performing a coarse placement process that assigns initial locations on a semiconductor chip to the cells;

using a computer, performing a detailed placement process that assigns a final location to each of the cells by optimizing a cost function dependent on the sites in pairs of rows, wherein each cell location is aligned with a valid site boundary, no two cells are overlapping, and each cell is assigned to a group of legal sites; and using a subroutine that legalizes rows optimally according to a y-displacement metric in one of quadratic and polynomial run time.

30. A method for quickly placing cells of a netlist, the method comprising:

performing a coarse placement process that assigns initial locations on a semiconductor chip to the cells; and using a computer, performing a detailed placement process including a dynamic programming row swapping technique that assigns a final location to each of the cells, wherein each cell location is aligned with a valid site boundary, wherein no two cells are overlapping, and wherein each cell is assigned to a group of legal sites so that each cell is placed on the legal sites, wherein the dynamic programming row swapping technique includes:

removing all cells from a pair of rows;

combining removed cells in a list; and replacing the removed cells in the pair of rows one at a time based on lowest x-attract location.

31. The method of claim 30, wherein the detailed placement process runs in linear time.

32. The method of claim 30, wherein a look-ahead parameter is used in the dynamic programming row swapping technique to control swapping of cells between pairs of rows.

33. The method of claim 30, wherein the detailed placement process further comprises pruning a search space during the dynamic programming row swapping technique to perform swapping of cells between the pairs of rows.

34. The method of claim 33, wherein pruning is controlled as a function of a gap count.

35. The method of claim 30, wherein the detailed placement process includes a subroutine that finds an optimal legal cell location assignment for a single row in an absence of blockages.

36. The method of claim 30, wherein the detailed placement process further comprises assigning an initial cell location based on a result of the coarse placement process.

37. The method of claim 36, wherein the coarse placement process includes an unconstrained non-linear optimization technique.

38. The method of claim 37, wherein the unconstrained non-linear optimization technique includes a conjugate gradient method.

39. The method of claim 30, wherein the detailed placement process further comprises optimizing a y-location of the cells during initial cell location assignment.

40. The method of claim 30, wherein the detailed placement process further comprises performing a greedy cleanup phase.

* * * * *

UNITED STATES PATENT AND TRADEMARK OFFICE
CERTIFICATE OF CORRECTION

PATENT NO. : 8,069,429 B2
APPLICATION NO. : 12/140146
DATED : November 29, 2011
INVENTOR(S) : Ronald Miller et al.

It is certified that error appears in the above-identified patent and that said Letters Patent is hereby corrected as shown below:

In the Claims

<u>Column 21</u>
Line 23, insert --the-- before "pairs".

<u>Column 22</u>
Line 14, insert --the-- before "initial".

<u>Column 23</u>
Line 13, amend "the sites" to --cell sites--.
Line 39, amend "the sites" to --cell sites--.
Line 52, amend "the sites" to --cell sites--.

<u>Column 24</u>
Indent lines 18-21.
Line 30, amend "pairs" to --pair--.
Line 31, insert --the-- before "pruning".

Signed and Sealed this
Twentieth Day of May, 2014

Michelle K. Lee
*Deputy Director of the United States Patent and Trademark Office*